(12) United States Patent
Harada et al.

(10) Patent No.: US 10,607,833 B2
(45) Date of Patent: Mar. 31, 2020

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Katsuyoshi Harada, Toyama (JP); Takashi Ozaki, Toyama (JP); Masato Terasaki, Toyama (JP); Risa Yamakoshi, Toyama (JP); Satoshi Shimamoto, Toyama (JP); Jiro Yugami, Toyama (JP); Yoshiro Hirose, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/376,944

(22) Filed: Dec. 13, 2016

(65) Prior Publication Data

US 2017/0170004 A1    Jun. 15, 2017

(30) Foreign Application Priority Data

Dec. 14, 2015    (JP) .................................. 2015-243505

(51) Int. Cl.
*H01L 21/02*    (2006.01)
*H01L 29/66*    (2006.01)
(Continued)

(52) U.S. Cl.
CPC ........ *H01L 21/0228* (2013.01); *C23C 16/402* (2013.01); *C23C 16/45527* (2013.01);
(Continued)

(58) Field of Classification Search
None
See application file for complete search history.

(56) References Cited

U.S. PATENT DOCUMENTS

| | | | | |
|---|---|---|---|---|
| 5,910,019 | A | * | 6/1999 | Watanabe ......... H01L 27/10852 257/E21.013 |
| 7,419,888 | B2 | * | 9/2008 | Yang ...................... B82Y 10/00 438/479 |

(Continued)

FOREIGN PATENT DOCUMENTS

| | | |
|---|---|---|
| JP | 2006-054432 A | 2/2006 |
| JP | 2006-190787 A | 7/2006 |

(Continued)

OTHER PUBLICATIONS

Korean Office Action dated Jul. 16, 2018 for the Korean Patent Application No. 10-2016-0169910.

(Continued)

*Primary Examiner* — David E Graybill
(74) *Attorney, Agent, or Firm* — Volpe and Koenig, P.C.

(57) ABSTRACT

There is provided a method of manufacturing a semiconductor device, including forming a film on a substrate by performing a cycle a predetermined number of times, the cycle including non-simultaneously performing supplying a precursor gas to the substrate; and supplying a first oxygen-containing gas to the substrate. Further, the act of supplying the precursor gas includes a time period in which the precursor gas and a second oxygen-containing gas are simultaneously supplied to the substrate.

15 Claims, 11 Drawing Sheets

(51) Int. Cl.
  *C23C 16/40* (2006.01)
  *C23C 16/455* (2006.01)
  *C23C 16/52* (2006.01)
(52) U.S. Cl.
  CPC ........ *C23C 16/52* (2013.01); *H01L 21/02164* (2013.01); *H01L 21/02211* (2013.01); *H01L 29/66795* (2013.01)

(56) References Cited

U.S. PATENT DOCUMENTS

| | | | | |
|---|---|---|---|---|
| 8,236,684 B2* | 8/2012 | Chan | | H01L 21/02164 |
| | | | | 257/E21.476 |
| 8,252,701 B2* | 8/2012 | Sasajima | | C23C 16/402 |
| | | | | 438/774 |
| 8,481,422 B2* | 7/2013 | Chan | | H01L 21/02164 |
| | | | | 257/E21.476 |
| 8,822,350 B2* | 9/2014 | Yuasa | | C23C 16/40 |
| | | | | 438/584 |
| 8,901,014 B2* | 12/2014 | Ota | | H01L 21/0214 |
| | | | | 257/E21.282 |
| 9,006,116 B2* | 4/2015 | Terasaki | | C23C 16/402 |
| | | | | 438/787 |
| 9,039,838 B2* | 5/2015 | Sasajima | | C23C 16/402 |
| | | | | 118/725 |
| 9,190,264 B2* | 11/2015 | Yuasa | | H01L 21/02532 |
| 9,425,075 B2* | 8/2016 | Sano | | H01L 21/67109 |
| 9,552,980 B2* | 1/2017 | Ozaki | | H01L 21/67109 |
| 9,966,251 B2* | 5/2018 | Sasajima | | C23C 16/402 |
| 9,966,252 B2* | 5/2018 | Sasajima | | C23C 16/402 |
| 2006/0032442 A1 | 2/2006 | Hasebe | | |
| 2007/0066083 A1* | 3/2007 | Yang | | B82Y 10/00 |
| | | | | 438/764 |
| 2007/0234957 A1* | 10/2007 | Lee | | C23C 16/402 |
| | | | | 118/715 |
| 2009/0170345 A1* | 7/2009 | Akae | | H01L 21/0214 |
| | | | | 438/786 |
| 2009/0325381 A1* | 12/2009 | Chan | | H01L 21/02164 |
| | | | | 438/675 |
| 2010/0105192 A1 | 4/2010 | Akae et al. | | |
| 2011/0076857 A1* | 3/2011 | Akae | | C23C 16/32 |
| | | | | 438/769 |
| 2011/0124204 A1* | 5/2011 | Ota | | C23C 16/402 |
| | | | | 438/787 |
| 2011/0130011 A1* | 6/2011 | Sasajima | | C23C 16/402 |
| | | | | 438/770 |
| 2012/0208366 A1* | 8/2012 | Chan | | H01L 21/02164 |
| | | | | 438/700 |
| 2013/0017685 A1* | 1/2013 | Akae | | C23C 16/30 |
| | | | | 438/703 |
| 2013/0084712 A1* | 4/2013 | Yuasa | | H01L 21/02532 |
| | | | | 438/763 |
| 2013/0252434 A1* | 9/2013 | Yuasa | | H01L 21/02104 |
| | | | | 438/758 |
| 2014/0099797 A1* | 4/2014 | Terasaki | | C23C 16/402 |
| | | | | 438/787 |
| 2014/0220788 A1* | 8/2014 | Sano | | H01L 21/67109 |
| | | | | 438/775 |
| 2014/0242809 A1* | 8/2014 | Hashimoto | | H01L 21/02126 |
| | | | | 438/778 |
| 2014/0287594 A1* | 9/2014 | Terasaki | | H01L 21/02164 |
| | | | | 438/770 |
| 2014/0287595 A1* | 9/2014 | Shimamoto | | H01L 21/02126 |
| | | | | 438/774 |
| 2014/0315393 A1* | 10/2014 | Ozaki | | H01L 21/67109 |
| | | | | 438/786 |
| 2014/0357058 A1 | 12/2014 | Takagi et al. | | |
| 2015/0214028 A1* | 7/2015 | Sasajima | | C23C 16/402 |
| | | | | 438/785 |
| 2015/0214042 A1* | 7/2015 | Sasajima | | C23C 16/402 |
| | | | | 438/785 |
| 2017/0170004 A1* | 6/2017 | Harada | | C23C 16/45527 |

FOREIGN PATENT DOCUMENTS

| | | |
|---|---|---|
| JP | 2010-153776 A | 7/2010 |
| JP | 2013-135126 A | 7/2013 |
| JP | 2013-179239 A | 9/2013 |
| JP | 2014-236129 A | 12/2014 |
| KR | 10-2013-0047594 A | 5/2013 |
| KR | 10-2015-0002495 A | 1/2015 |
| KR | 10-2015-0018455 A | 2/2015 |

OTHER PUBLICATIONS

Japanese Office Action dated Jan. 29, 2019 for the Japanese Patent Application No. 2015-243505.

* cited by examiner

Implementation example

Comparative example

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-243505, filed on Dec. 14, 2015, the entire contents of which are incorporated herein by reference.

TECHNICAL FIELD

The present disclosure relates to a method of manufacturing a semiconductor device, a substrate processing apparatus, and a recording medium.

BACKGROUND

As one of processes for manufacturing a semiconductor device, a film forming process for forming an O-containing film on a substrate is often carried out by performing a cycle a predetermined number of times that non-simultaneously performs a step of supplying a precursor gas to the substrate and a step of supplying an oxygen (O)-containing gas to the substrate.

SUMMARY

The present disclosure provides some embodiments of a technique capable of enhancing smoothness of a surface of an O-containing film that is formed on a substrate.

According to one embodiment of the present disclosure, there is provided a technique of manufacturing a semiconductor device, including forming a film on a substrate by performing a cycle a predetermined number of times, the cycle including non-simultaneously performing supplying a precursor gas to the substrate; and supplying a first oxygen-containing gas to the substrate, wherein the act of supplying the precursor gas includes a time period in which the precursor gas and a second oxygen-containing gas are simultaneously supplied to the substrate.

DETAILED DESCRIPTION

One Embodiment of the Present Disclosure

One embodiment of the present disclosure is described below with reference to FIGS. 1 to 3.

(1) CONFIGURATION OF SUBSTRATE PROCESSING APPARATUS

Figure 1:
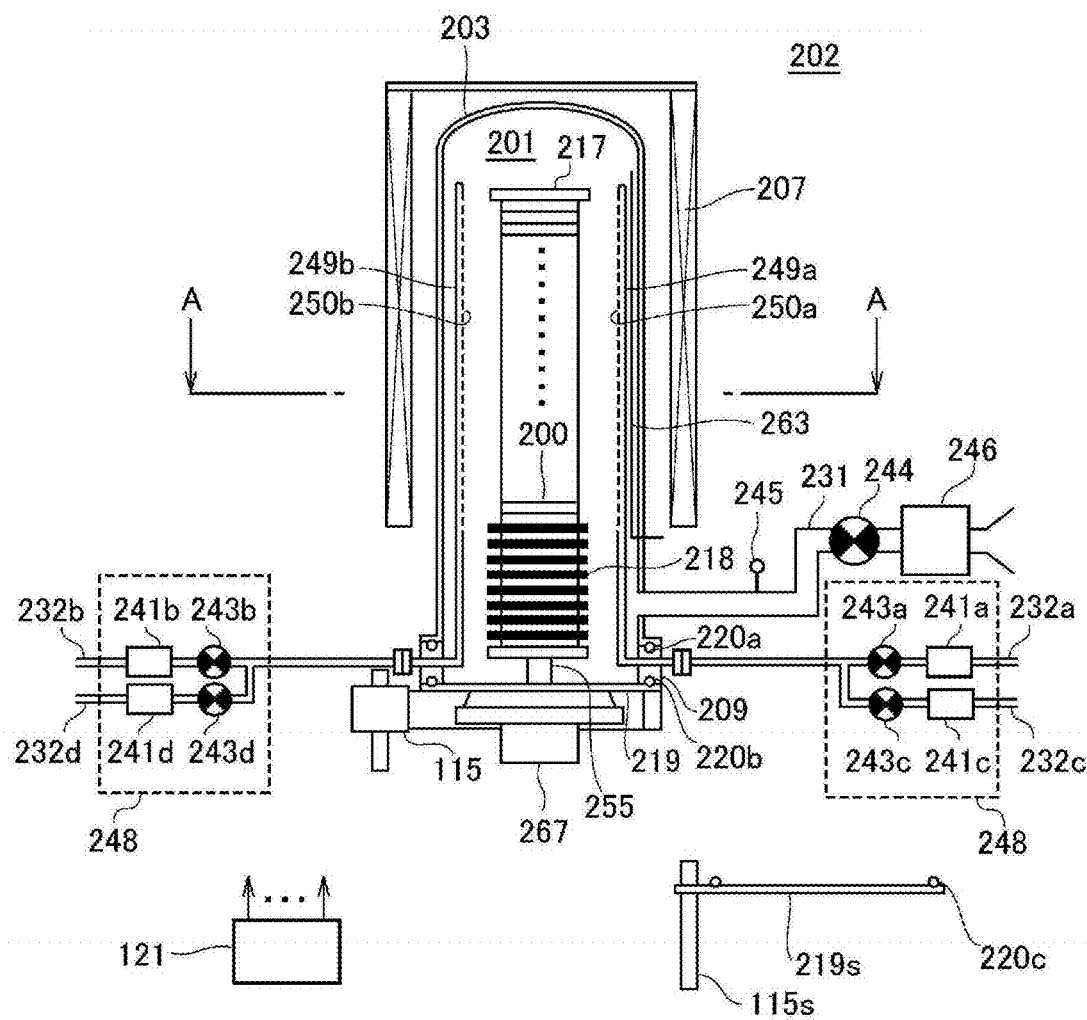
FIG. 1 schematically illustrates a configuration of a vertical processing furnace of a substrate processing apparatus suitably employed in one embodiment of the present disclosure, in which a portion of the processing furnace is shown in a vertical cross-sectional view.
Figure 2:
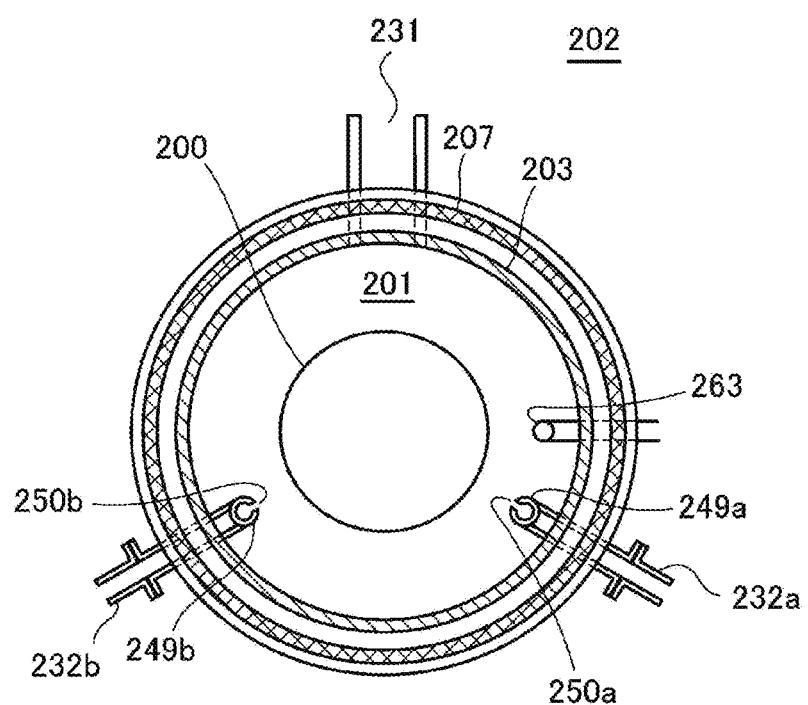
FIG. 2 schematically illustrates a configuration of the vertical processing furnace of the substrate processing apparatus suitably employed in one embodiment of the present disclosure, in which a portion of the processing furnace is shown in a cross-sectional view taken along Line A-A in FIG. 1.

As illustrated in FIG. 1, a processing furnace 202 includes a heater 207 serving as a heating mechanism (temperature adjustment part). The heater 207 is of a cylindrical shape and is supported by a heater base (not shown) serving as a support plate to be vertically installed. As described below, the heater 207 functions as an activation mechanism (an excitation part) configured to thermally activate (or excite) gas.

A reaction tube 203 is disposed inside the heater 207 to be concentric with the heater 207. The reaction tube 203 is made of a heat resistant material such as quartz ($SiO_2$), silicon carbide (SiC), and the like, and is of a cylindrical shape with its upper end closed and its lower end opened. A manifold (inlet flange) 209 is arranged below the reaction tube 203 to be concentric with the reaction tube 203. The manifold 209 is made of metal, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base to be installed in a vertical state. A processing vessel (reaction vessel) is mainly configured by the reaction tube 203 and the manifold 209. A process chamber 201 is formed in a hollow cylindrical portion of the processing vessel. The process chamber 201 is configured to accommodate a plurality of wafers 200 as substrates. The wafers 200 are horizontally stacked in multiple stages along a vertical direction in a boat 217 that is described below.

Nozzles 249a and 249b penetrate a sidewall of the manifold 209 and are installed in the process chamber 201. Gas supply pipes 232a and 232b are connected to the nozzles 249a and 249b, respectively. In this manner, the two nozzles 249a and 249b and the two gas supply pipes 232a and 232b are installed to a process vessel (or the manifold 209) and are capable of supplying a plurality of kinds of gases into the process chamber 201.

Mass flow controllers (MFCs) 241a and 241b, which are flow rate controllers (flow rate control parts), and valves 243a and 243b, which are opening/closing valves, are installed to the gas supply pipes 232a and 232b, respectively, sequentially from upstream sides of the gas supply pipes 232a and 232b. Gas supply pipes 232c and 232d, which supply inert gas, are connected to the gas supply pipes 232a and 232b, respectively, at downstream sides of the valves 243a and 243b. MFCs 241c and 241d, which are flow rate controllers (flow rate control parts), and valves 243c and 243d, which are opening/closing valves, are installed to the gas supply pipes 232c and 232d, respectively, sequentially from upstream sides of the gas supply pipes 232c and 232d.

The nozzles 249a and 249b are connected to front end portions of the gas supply pipes 232a and 232b. As illustrated in FIG. 2, each of the nozzles 249a and 249b is installed in an annular-shaped space in a plan view, between an inner wall of the reaction tube 203 and the wafers 200 such that the nozzles 249a and 249b extend upward along a stacked direction of the wafers 200 from a lower portion to an upper portion of the inner wall of the reaction tube 203. Specifically, each of the nozzles 249a and 249b is installed to extend along a wafer arrangement region where the wafers 200 are arranged, in a region which horizontally surrounds the wafer arrangement region at a lateral side of the wafer arrangement region. As such, each of the nozzles 249a and 249b is installed to be perpendicular to surfaces (flat surfaces) of the wafers 200 at a lateral side of end portions (peripheral edge portions) of the wafers 200, which are loaded into the process chamber 201. Each of the nozzles 249a and 249b is configured as an L-shaped long nozzle, and its horizontal portion is installed to penetrate the sidewall of the manifold 209 and its vertical portion is installed to extend upward at least from one end portion to the other end portion of the wafer arrangement region. Gas supply holes 250a and 250b for supplying gas are formed on side surfaces of the nozzles 249a and 249b, respectively. The gas supply holes 250a and 250b are opened toward the center of the reaction tube 203 and are capable of supplying gas toward the wafers 200. A plurality of gas supply holes 250a and 250b may be formed between a lower portion and an upper portion of the reaction tube 203. Each of the gas supply holes 250a and 250b may have the same opening area and may be formed at the same aperture pitch.

As described above, in the present embodiment, the gas is transferred through the nozzles 249a and 249b, which are disposed in a vertically-elongated space of an annular shape in a plan view, i.e., a cylindrical space, defined by an inner surface of a sidewall of the reaction tube 203 and the end portions (peripheral edge portions) of the wafers 200 arranged within the reaction tube 203. The gas is initially injected into the reaction tube 203, near the wafers 200, through the gas supply holes 250a and 250b formed in the nozzles 249a and 249b. Accordingly, the gas supplied into the reaction tube 203 mainly flows in the reaction tube 203 in a direction parallel to the surfaces of the wafers 200, i.e., in a horizontal direction. With this configuration, the gas can be supplied uniformly to each of the wafers 200. This makes it possible to improve uniformity in thickness of a film formed on each of the wafers 200. In addition, the gas flowing on the surfaces of the wafers 200 after the reaction, i.e., residual gas after the reaction, flows toward an exhaust port, i.e., an exhaust pipe 231, which is described below. The flow direction of the residual gas is not limited to a vertical direction but may be appropriately adjusted depending on the position of the exhaust port.

A precursor gas containing a predetermined element (main element), for example, a halosilane precursor gas containing Si as the predetermined element and a halogen element, is supplied from the gas supply pipe 232a into the process chamber 201 via the MFC 241a, the valve 243a, and the nozzle 249a.

The precursor gas refers to a gaseous precursor, for example, a gas obtained by vaporizing a precursor that is in a liquid state under a room temperature and an atmospheric pressure, or a precursor that is in a gas state under a room temperature and an atmospheric pressure. The halosilane precursor refers to a silane precursor having a halogen group. Examples of the halogen group may include a chloro group, a fluoro group, a bromo group, and an iodine group. As such, the halogen group includes a halogen element such as chlorine (Cl), fluorine (F), bromine (Br), iodine (I), or the like. The halosilane precursor may be referred to as a kind of halide. When the term "precursor" is used herein, it may refer to "a liquid precursor in a liquid state," "a precursor gas in a gaseous state," or both of them.

As the halosilane precursor gas, it may be possible to use, for example, a precursor gas containing Si and Cl, namely a chlorosilane precursor gas. As the chlorosilane precursor gas, it may be possible to use, for example, hexachlorodisilane ($Si_2Cl_6$, abbreviation: HCDS) gas. In the case of using a liquid precursor such as HCDS or the like which is in a liquid state under a room temperature and an atmospheric pressure, the liquid precursor is vaporized by a vaporization system such as a vaporizer, a bubbler, or the like, and is supplied as a precursor gas (HCDS gas).

A reaction gas (reactant), for example, an oxygen (O)-containing gas, is supplied from the gas supply pipe 232b into the process chamber 201 via the MFC 241b, the valve 243b, and the nozzle 249b. In the present disclosure, the O-containing gas supplied in Step 2 of a film forming process, which is described below, may be referred to as a first O-containing gas. Furthermore, the O-containing gas supplied in Step 1 of the film forming process may be referred to as a second O-containing gas. The first O-containing gas acts as an oxidizing gas, namely an O source, in Step 2 of the film forming process. The second O-containing gas acts as a migration suppressing gas, which suppresses the migration of Si adsorbed onto the wafers 200, in Step 1 of the film forming process. As the first O-containing gas and the second O-containing gas, it may be possible to use, for example, oxygen ($O_2$) gas.

A reaction gas (reactant), for example, a hydrogen (H)-containing gas, is supplied from the gas supply pipe 232a into the process chamber 201 via the MFC 241a, the valve 243a, and the nozzle 249a. The H-containing gas does not provide an oxidizing action by itself. However, in the film forming process which is described below, the H-containing gas reacts with the O-containing gas under a specific condition to generate oxidizing species such as atomic oxygen (O) or the like and act to improve efficiency of an oxidizing process. Thus, with the O-containing gas, the H-containing gas may be included in the oxidizing gas. As the H-containing gas, it may be possible to use, for example, hydrogen ($H_2$) gas.

Inert gas, for example, nitrogen ($N_2$) gas, is supplied from the gas supply pipes 232c and 232d into the process chamber 201 via the MFCs 241c and 241d, the valves 243c and 243d, the gas supply pipes 232a and 232b, and the nozzles 249a and 249b.

In the case of supplying the precursor gas from the gas supply pipe 232a, a precursor gas supply system mainly includes the gas supply pipe 232a, the MFC 241a, and the valve 243a. The precursor gas supply system may further include the nozzle 249a. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

In the case of supplying the O-containing gas from the gas supply pipe 232b, an O-containing gas supply system mainly include the gas supply pipe 232b, the MFC 241b, and the valve 243b. The O-containing gas supply system may further include the nozzle 249b. In Step 2 of the film forming process, the O-containing gas supply system functions as an oxidizing gas supply system or an oxidant supply system. Furthermore, in Step 1 of the film forming process, the O-containing gas supply system functions as a migration suppressing gas supply system.

In the case of supplying the H-containing gas from the gas supply pipe 232a, an H-containing gas supply system mainly includes the gas supply pipe 232a, the MFC 241a, and the valve 243a. The H-containing gas supply system may further include the nozzle 249a. The H-containing gas supply system may be included in the oxidizing gas supply system (the oxidant supply system) described above.

One or all of the precursor gas supply system, the O-containing gas supply system, and the H-containing gas supply system may be referred to as a film forming gas supply system. Furthermore, one or both of the O-containing gas supply system and the H-containing gas supply system may be referred to as a reaction gas (reactant) supply system.

In addition, an inert gas supply system mainly includes the gas supply pipes 232c and 232d, the MFCs 241c and 241d, and the valves 243c and 243d. The inert gas supply system may be referred to as a purge gas supply system or a carrier gas supply system.

One or all of the various kinds of gas supply systems as described above may be configured as an integrated gas supply system 248 in which the valves 243a to 243d and the MFCs 241a to 241d are integrated. The integrated gas supply system 248 is connected to each of the gas supply pipes 232a to 232d and is configured such that operations of supplying various kinds of gases into the gas supply pipes 232a to 232d, namely opening/closing operations of the valves 243a to 243d and flow rate adjustment operations of the MFCs 241a to 241d, are controlled by a controller 121, which is described below. The integrated gas supply system 248 is configured as an integral integrated unit or split integrated units, and is configured such that the integrated gas supply system 248 can be removably mounted to the gas supply pipes 232a to 232d on an integrated unit basis and such that the maintenance, the replacement, and the expansion of the integrated gas supply system 248 can be performed on an integrated unit basis The exhaust pipe 231 configured to exhaust an internal atmosphere of the process chamber 201 is installed to the reaction tube 203. A vacuum pump 246 serving as a vacuum exhaust device is connected to the exhaust pipe 231 via a pressure sensor 245 serving as a pressure detector (pressure detection part), which detects an internal pressure of the process chamber 201, and an auto pressure controller (APC) valve 244 serving as a pressure regulator (pressure regulation part). The APC valve 244 is a valve configured to be opened or closed, while the vacuum pump 246 operates, in order to vacuum-exhaust an interior of the process chamber 201 or stop the interior of the process chamber 201 from being vacuum-exhausted; and further configured to adjust its opening degree based on pressure information detected by the pressure sensor 245, while the vacuum pump 246 operates, in order to adjust the internal pressure of the process chamber 201. An exhaust system mainly includes the exhaust pipe 231, the APC valve 244, and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which is described below, is installed opposite to the process chamber 201 with respect to the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, namely the wafers 200, into and out of the process chamber 201. Furthermore, a shutter 219s as a furnace opening cover, which is capable of hermetically sealing the lower end opening of the manifold 209 when the boat 217 is removed out of the process chamber 201 by moving the seal cap 219 downward, is installed under the manifold 209. The shutter 219s is made of metal such as stainless steel or the like, and is formed in a disc shape. An O-ring 220c as a seal member making contact with the lower end portion of the manifold 209 is installed on an upper surface of the shutter 219s. An opening/closing operation (an up/down movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in a horizontal posture and in multiple stages along the vertical direction with the centers of the wafers 200 aligned with one another, that is, to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to the seal cap 219. However, the present embodiment is not limited to the above configuration. For example, instead of installing the heat insulating plates 218 below the boat 217, a heat insulating tube as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L shape. The temperature sensor 263 is installed along the inner wall of the reaction tube 203.

Figure 3:
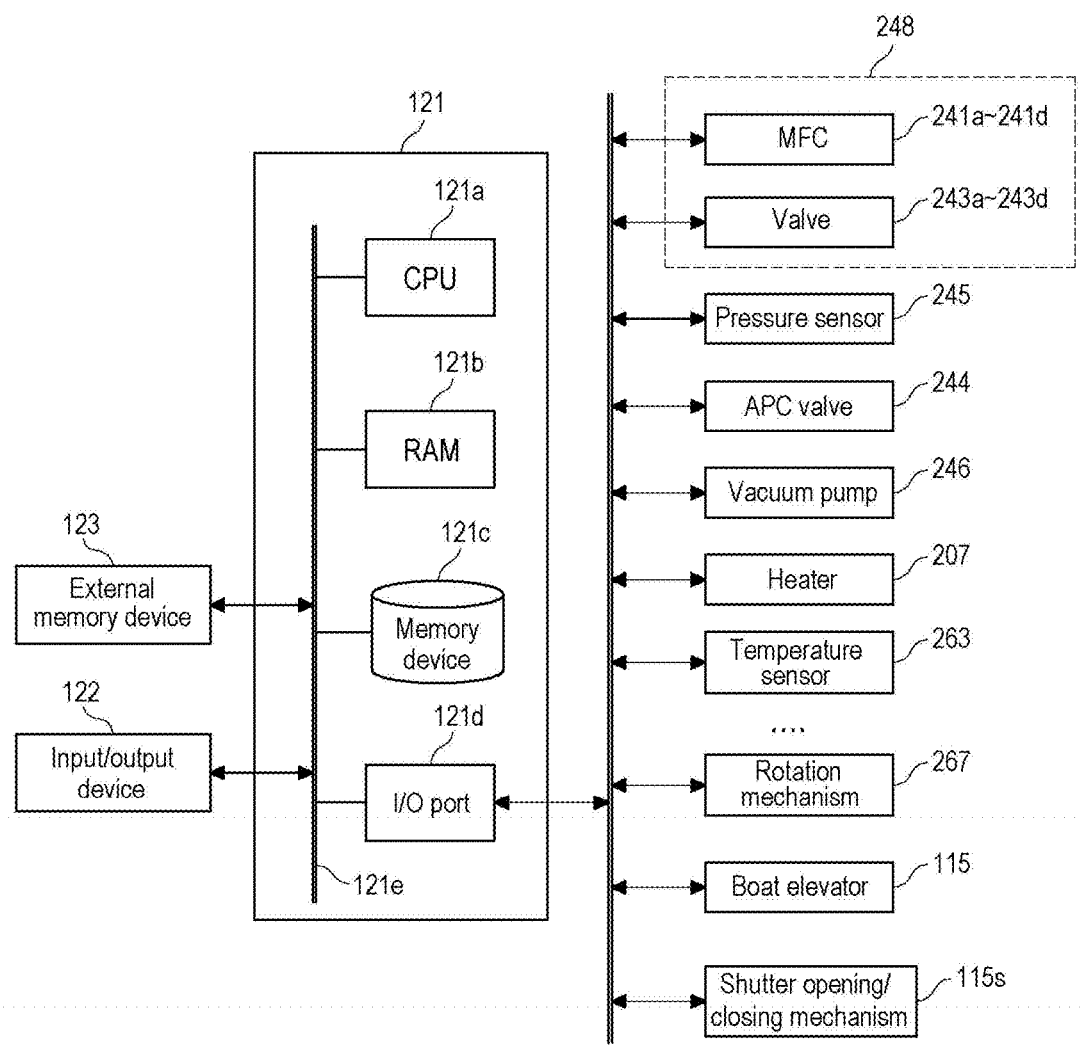
FIG. 3 schematically illustrates a configuration of a controller in the substrate processing apparatus suitably employed in one embodiment of the present disclosure, in which a control system of the controller is shown in the form of a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, for example, a touch panel or the like, is connected to the controller 121.

The memory device 121c is configured, for example, by a flash memory, a hard disc drive (HDD), or the like. A control program, by which operations of a substrate processing apparatus is controlled, or a process recipe, in which sequences and conditions of a film forming process to be explained below are described, are readably stored in the memory device 121c. The process recipe functions as a program for causing the controller 121 to execute each sequence in the film forming process, which is described below, to obtain a predetermined result. Hereinafter, the process recipe and the control program may be generally and simply referred to as a "program." Furthermore, the process recipe may be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory device 121c and execute the control program. The CPU 121a also reads the recipe from the memory device 121c according to an input of an operation command from the input/output device 122. In addition, the CPU 121a is configured to control, according to the content of the read recipe, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operations of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a computer-readable recording medium. Hereinafter, the memory device 121c and the external memory device 123 may be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) FILM FORMING PROCESS

A sequence example of forming a film on a substrate using the aforementioned substrate processing apparatus, which is one of the processes for manufacturing a semiconductor device, is described below with reference to FIG. 4. In the following descriptions, the operations of the individual parts that constitute the substrate processing apparatus are controlled by the controller 121.

In a basic sequence illustrated in FIG. 4, a silicon oxide film ($SiO_2$ film) (hereinafter, also simply referred to as an SiO film) as a film containing Si and O is formed on a wafer 200 as a substrate by performing a cycle a predetermined number of times (e.g., n times or more) that includes non-simultaneously or non-synchronously performing the following steps:

Step 1 of supplying HCDS gas as a precursor gas to the wafer 200; and

Step 2 of supplying $O_2$ gas as a first O-containing gas to the wafer 200.

Figure 4:
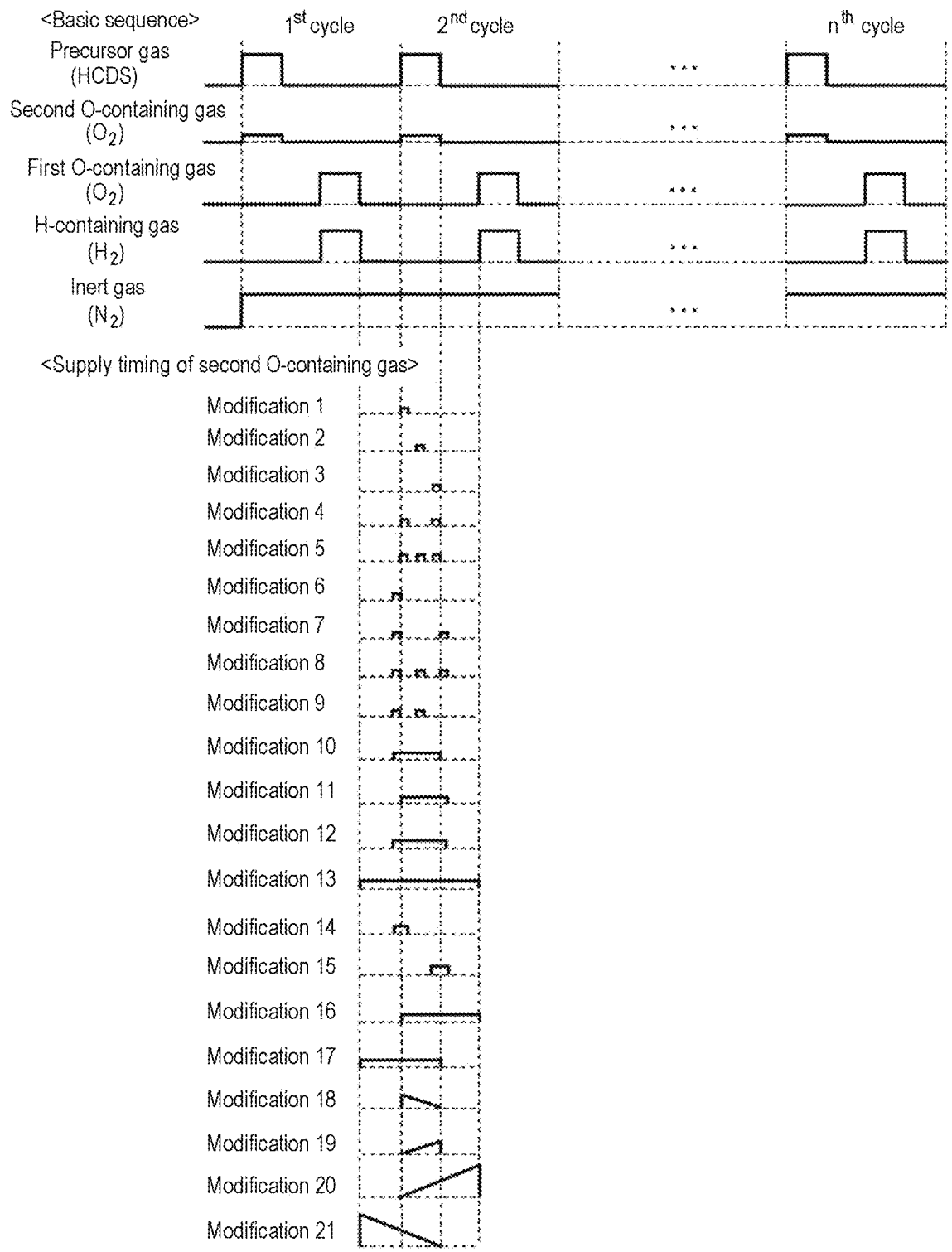
FIG. 4 illustrates gas supply timings in a film forming process according to one embodiment of the present disclosure and modification examples of the gas supply timings.

The basic sequence illustrated in FIG. 4 includes a time period in which the HCDS gas and the $O_2$ gas as a second O-containing gas are simultaneously supplied to the wafer 200. Furthermore, the basic sequence illustrated in FIG. 4 includes a time period in which the $O_2$ gas as the first O-containing gas and $H_2$ gas as an H-containing gas are simultaneously supplied to the wafer 200.

In the present disclosure, for the sake of convenience, the film forming process described above may be denoted as follows. The same denotation will be used in modification examples and other embodiments that are described below.

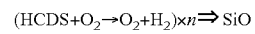

$(HCDS+O_2 \rightarrow O_2+H_2) \times n \Rightarrow SiO$

When the term "wafer" is used herein, it may refer to "a wafer itself" or "a laminated body (aggregate) of a wafer and a predetermined layer or film formed on a surface of the wafer." That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment Step)

The interior of the process chamber 201, namely the space in which the wafers 200 exist, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired film forming temperature. In this operation, the state of supplying electric power to the heater 207 is feedback-controlled based on temperature information detected by the temperature sensor 263 such that the interior of the process chamber 201 has a desired temperature distribution. In addition, heating the interior of the process chamber 201 by the heater 207 may be continuously performed at least until the processing of the wafers 200 is completed. Further, the rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film Forming Step)

Thereafter, following Steps 1 and 2 are sequentially performed.

[Step 1]

In this step, the HCDS gas and the $O_2$ gas are simultaneously supplied to the wafers 200 in the process chamber 201. As such, Step 1 includes a time period in which the HCDS gas and the $O_2$ gas are simultaneously supplied.

The valves 243a and 243b are opened to allow the HCDS gas and the $O_2$ gas to flow through the gas supply pipes 232a and 232b, respectively. Flow rates of the HCDS gas and the $O_2$ gas are adjusted by the MFCs 241a and 241b, respectively. The HCDS gas and the $O_2$ gas are supplied into the process chamber 201 via the nozzles 249a and 249b and are exhausted from the exhaust pipe 231. In this operation, the HCDS gas and the $O_2$ gas are simultaneously supplied to the wafers 200. Further, the valves 243c and 243d are opened to allow $N_2$ gas to flow through the gas supply pipes 232c and 232d. Flow rates of the $N_2$ gas through the gas supply pipes 232c and 232d are adjusted by the MFCs 241c and 241d. The $N_2$ gas is supplied into the process chamber 201 together with the HCDS gas and the $O_2$ gas and is exhausted from the exhaust pipe 231.

In this operation, the APC valve 244 is appropriately adjusted to set the internal pressure of the process chamber 201 to a pressure which falls within a range, for example, of 0.1 to 20 Torr (13.3 to 2,666 Pa), preferably 1 to 10 Torr (133 to 1,333 Pa).

If the internal pressure of the process chamber 201 is lower than 0.1 Torr, a SiO film is less likely to be formed on the wafer 200 and a practical deposition rate may not be obtained. By setting the internal pressure of the process chamber 201 to 0.1 Torr or greater, it is possible to increase the deposition rate of the SiO film to a practical level. By setting the internal pressure of the process chamber 201 to 1 Torr or greater, it is possible to further increase the deposition rate of the SiO film.

If the internal pressure of the process chamber 201 exceeds 20 Torr, an excessive gas phase reaction may occur. In this case, the film thickness uniformity of the SiO film formed on the wafer 200 may be easily deteriorated. Furthermore, a large amount of particles may be generated in the process chamber 201 and quality of a film forming process may decline. Moreover, the flatness of a surface of the SiO film, namely surface roughness, may be deteriorated. The term "surface roughness" used herein refers to height difference of a film within a wafer plane and has the same meaning as surface coarseness. The expression that the surface roughness is improved means that the height difference becomes smaller and the surface becomes smooth. The expression that the surface roughness is deteriorated means that the height difference becomes larger and the surface becomes rough. By setting the internal pressure of the process chamber 201 to 20 Torr or lower, it is possible to generate a moderate gas phase reaction. This makes it possible to improve the film thickness uniformity and the surface roughness of the SiO film and to suppress the generation of particles. By setting the internal pressure of the process chamber 201 to 10 Torr or lower, it is possible to reliably improve the film thickness uniformity and the surface roughness of the SiO film and to reliably suppress the generation of particles within the process chamber 201.

Thus, it is preferred that the internal pressure of the process chamber 201 is set to a pressure which falls within a range, for example, of 0.1 to 20 Torr, preferably 1 to 10 Torr.

A supply flow rate of the HCDS gas controlled by the MFC 241a is set to a flow rate which falls within a range, for example, of 1 to 2,000 sccm, preferably 10 to 1,000 sccm.

A supply flow rate $F_1$ of the $O_2$ gas controlled by the MFC 241b is set such that a supply amount $Q_1$ of the $O_2$ gas (the second O-containing gas) in Step 1 per cycle becomes smaller than a supply quantity $Q_2$ of the $O_2$ gas (the first O-containing gas) in Step 2, which is described below, per cycle (i.e., $Q_1 < Q_2$). In the case where a supply time of the $O_2$ gas in Step 1 and a supply time of the $O_2$ gas in Step 2, which is described below, are set equal to each other, the supply flow rate $F_1$ is set to be lower than a supply flow rate $F_2$ of the $O_2$ gas controlled by the MFC 241b in Step 2 to be described below, which can make the supply amount $Q_1$ smaller than the supply amount $Q_2$. From the viewpoint of the in-plane film thickness uniformity of the SiO film formed on the wafer 200, it is preferred that the supply flow rate $F_1$ is set to be lower than the supply flow rate $F_2$ (i.e., $F_1 < F_2$). For example, a ratio of the supply flow rate $F_1$ to the supply flow rate $F_2$ may be set to be greater than or equal to 1/20, and smaller than or equal to 1/2, preferably greater than or equal to 1/10, and smaller than or equal to 1/5. The supply flow rate $F_2$ is a flow rate at which a first layer formed in Step 1 can be sufficiently oxidized in Step 2 to be described below.

If the supply flow rate $F_1$ is less than 1/20 of the supply flow rate $F_2$, the effect of suppressing the migration of Si by the $O_2$ gas, which is described below, may not be obtained and the surface roughness of the SiO film formed on the wafer 200 is likely to be deteriorated. By setting the supply flow rate $F_1$ to 1/20 of the supply flow rate $F_2$ or greater, the migration suppressing effect can be obtained and the surface roughness of the SiO film can be improved. By setting the supply flow rate $F_1$ to 1/10 of the supply flow rate $F_2$ or greater, the migration suppressing effect can be reliably obtained and the surface roughness of the SiO film can be reliably improved.

If the supply flow rate $F_1$ exceeds 1/2 of the supply flow rate $F_2$, an excessive gas phase reaction may occur. Thus, the film thickness uniformity of the SiO film formed on the wafer 200 may be easily deteriorated. By setting the supply flow rate $F_1$ to 1/2 of the supply flow rate $F_2$ or smaller, it is possible to generate a moderate gas phase reaction. It is therefore possible to improve the film thickness uniformity of the SiO film. By setting the supply flow rate $F_1$ to 1/5 of the supply flow rate $F_2$ or smaller, it is possible to moderately suppress a gas phase reaction and to reliably improve the film thickness uniformity of the SiO film.

Accordingly, it is preferred that the ratio of the supply flow rate $F_1$ to the supply flow rate $F_2$ is set to be greater than or equal to 1/20, and smaller than or equal to 1/2, preferably greater than or equal to 1/10, and smaller than or equal to 1/5. The supply flow rate $F_1$ may be set to a flow rate which falls within a range, for example, of 1 to 1,000 sccm.

Each of supply flow rates of the $N_2$ gas controlled by the MFC 241c and 241d is set to a flow rate which falls within a range, for example, of 100 to 10,000 sccm.

The temperature of the heater 207 is set such that the temperature of the wafer 200 becomes a temperature which falls within a range, for example, of 450 to 1,000 degrees C., preferably 600 to 1,000 degrees C., more preferably 700 to 900 degrees C.

If the temperature of the wafer 200 is lower than 450 degrees C., the SiO film is less likely to be formed on the wafer 200 and a practical deposition rate may not be obtained. By setting the temperature of the wafer 200 to 450 degrees C. or higher, it is possible to solve this problem. By setting the temperature of the wafer 200 to 600 degrees C. or higher, it is possible to improve etching resistance of the SiO film formed on the wafer 200 against hydrogen fluoride (HF) or the like. By setting the temperature of the wafer 200 to 700 degrees C. or higher, it is possible to further improve the etching resistance of the SiO film.

If the temperature of the wafer 200 exceeds 1,000 degrees C., an excessive gas phase reaction may occur. Thus, the film thickness uniformity of the SiO film formed on the wafer 200 may be easily deteriorated. Furthermore, a large amount of particles may be generated in the process chamber 201 and quality of the film forming process may decline. Moreover, the surface roughness of the SiO film may be deteriorated. By setting the temperature of the wafer 200 to 1,000 degrees C. or lower, it is possible to generate a moderate gas phase reaction. It is also possible to improve the film thickness uniformity and the surface roughness of the SiO film, and to suppress the generation of particles in the process chamber 201. By setting the temperature of the wafer 200 to 900 degrees C. or lower, it is possible to reliably improve the film thickness uniformity and the surface roughness of the SiO film, and to reliably suppress the generation of particles within the process chamber 201.

Accordingly, it is preferred that the temperature of the wafer 200 is set to a temperature which falls within a range of 450 to 1,000 degrees C., preferably 600 to 1,000 degrees C., more preferably 700 to 900 degrees C. This temperature range includes a temperature range in which the HCDS gas is pyrolized (autolyzed) when only the HCDS gas exists in the process chamber 201. Furthermore, this temperature range includes a temperature range in which the migration of Si contained in the HCDS gas occurs considerably on the surface of the wafer 200 when only the HCDS gas is supplied to the wafer 200.

The time period during which the HCDS gas and the $O_2$ gas are supplied to the wafer 200 is set to fall within a range, for example, of 1 to 100 seconds, preferably 1 to 50 seconds.

By supplying the HCDS gas and the $O_2$ gas to the wafer 200 under the aforementioned conditions, a first layer, for example, a Cl- and Si-containing layer having a thickness of from less than one atomic layer to several atomic layers (from less than one molecular layer to several molecular layers), is formed on an uppermost surface of the wafer 200. The Cl- and Si-containing layer may include a Cl-containing Si layer, an adsorption layer of HCDS, or both of them. The adsorption layer of HCDS may include a physical adsorption layer of HCDS, a chemisorption layer of HCDS, or both of them.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Cl- and Si-containing layer may include both a Si layer containing Cl and an adsorption layer of HCDS. For the sake of convenience, expressions such as "one atomic layer," "several atomic layers," and the like will be used with respect to the Cl- and Si-containing layer. There may be a case where the term "atomic layer" is used in the same meaning as the term "molecular layer."

Under a condition in which the HCDS gas is autolyzed, Si is deposited on the wafer 200 to form a Si layer containing Cl. Under a condition in which the HCDS gas is not autolyzed, HCDS is adsorbed onto the wafer 200 to form an adsorption layer of HCDS. From the viewpoint of increasing the deposition rate, it may be more advantageous to form the Si layer containing Cl on the wafer 200 than to form the adsorption layer of HCDS on the wafer 200. Hereinafter, for the sake of convenience, the Si layer containing Cl will be simply referred to as a Si-containing layer.

If the thickness of the first layer exceeds several atomic layers, a modifying action in Step 2, which is described below, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer to be one atomic layer or less, namely one atomic layer or less than one atomic layer, it is possible to relatively increase the action of the modifying reaction in Step 2, to be described below, and to shorten a time period required for the modifying reaction in Step 2. It is also possible to shorten a time period required for forming the first layer in Step 1. Consequently, it is possible to shorten a processing time period per cycle.

This makes it possible to shorten a total processing time. That is to say, it is possible to increase a deposition rate. Furthermore, by setting the thickness of the first layer to be one atomic layer or less, it is possible to enhance the controllability of the film thickness uniformity.

Figure 5A:
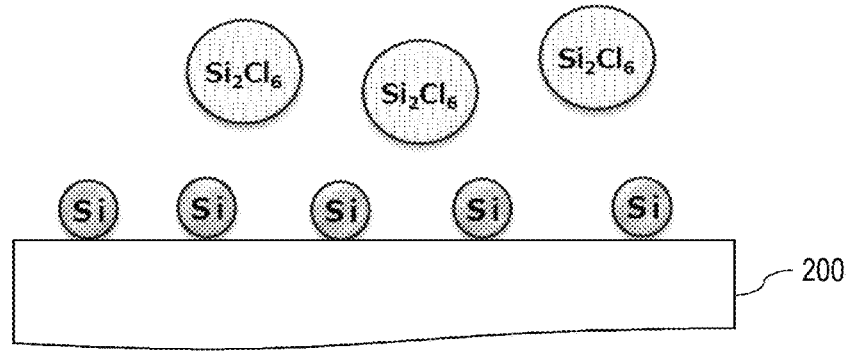
FIG. 5A illustrates a wafer surface when a precursor gas is supplied in the case of performing a film forming process at a relatively low temperature.
Figure 5B:
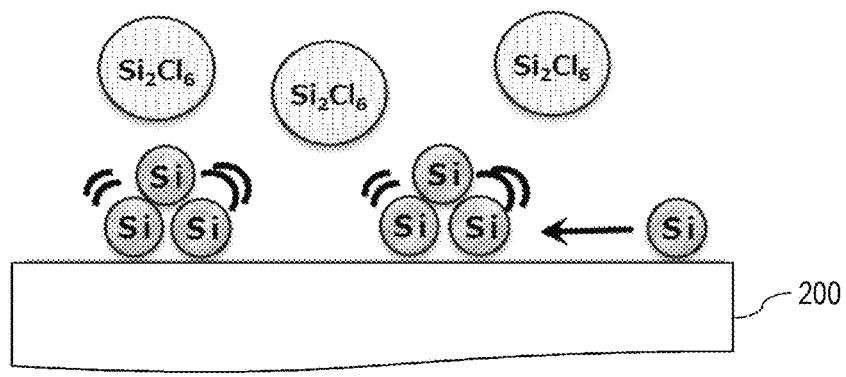
FIG. 5B illustrates that Si, which is adsorbed onto a wafer surface, migrates when a precursor gas is supplied in the case of performing a film forming process at a relatively high temperature.

In forming the first layer, the main element adsorbed onto the wafer 200, i.e., Si, contained in the first layer, may move (migrate) on the surface of the wafer 200. In particular, as the film forming temperature is set to be higher, the migration of Si tends to be more active. Thus, the surface roughness of the SiO film formed on the wafer 200 is easily deteriorated. FIG. 5A illustrates a surface of the wafer 200 when the HCDS gas is supplied in the case of performing the film forming process under the condition of a relatively low temperature, for example, of lower than 700 degrees C. In this temperature range, the migration of Si adsorbed onto the surface of the wafer 200 is relatively gentle and does not heavily affect the surface roughness of the SiO film. In contrast, FIG. 5B illustrates a surface of the wafer 200 when the HCDS gas is supplied in performing the film forming process under the condition of a relatively high temperature, for example, of 700 degrees C. or higher. In this temperature range, a considerable amount of the migration of Si adsorbed onto the surface of the wafer 200 occurs and Si aggregates before Step 2 is started. Thus, an uneven structure may be formed on the surface of the first layer. As a result, the interface roughness between the SiO film and its underlying layer or the surface roughness of the SiO film may be deteriorated.

Figure 5C:
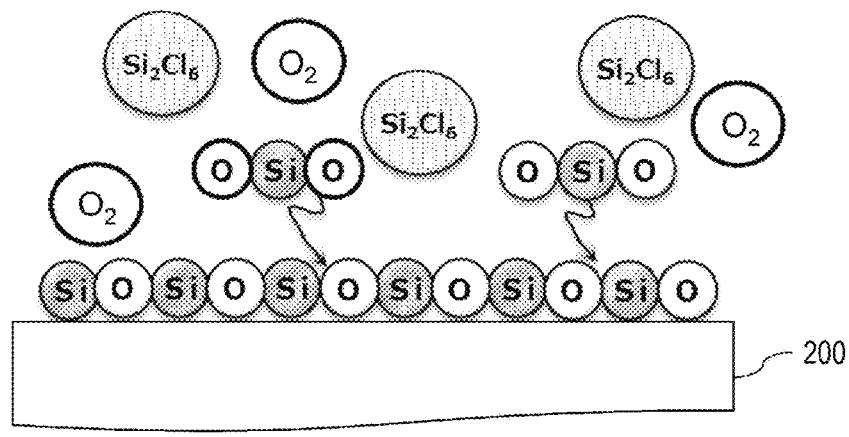
FIG. 5C illustrates that, when a precursor gas is supplied in the case of performing a film forming process at a relatively high temperature, a migration of Si, which is adsorbed onto a wafer surface, is suppressed by supplying oxygen gas together with the precursor gas.

In order to solve this problem, in the present embodiment, the HCDS gas and the $O_2$ gas are simultaneously supplied to the wafer 200 in Step 1. By supplying the $O_2$ gas together with the HCDS gas, simultaneously with, or before or after adsorption of Si onto the wafer 200, it is possible to convert at least a portion of Si to an oxide ($SiO_2$) by oxidation. Si adsorbed onto the wafer 200 is less likely to migrate due to the oxidation. As such, the migration of Si atoms adsorbed onto the wafer 200 is hindered by O atoms bonded to the Si atoms. Thus, even if the temperature of the wafer 200 is set to fall within the temperature range described above, it is possible to avoid deterioration of the interface roughness between the SiO film and its underlying layer or the surface roughness of the SiO film. FIG. 5C illustrates that migration of Si is suppressed by supplying $O_2$ gas together with HCDS gas. FIG. 5C illustrates, in an atom level, that Si atoms are oxidized and bonded to O atoms when the Si atoms are adsorbed onto the wafer 200, the migration of the Si atoms is blocked by the O atoms adjoining the Si atoms adsorbed onto the wafer 200, and the aggregation of Si is hindered. The $O_2$ gas supplied together with the HCDS gas is also referred to as a migration suppressing gas in view of its action. The inventors of the present disclosure have found that, even when the temperature of the wafer 200 is set to a temperature which falls within a range, for example, of 700 to 1,000 degrees C., by simultaneously supplying the HCDS gas and the $O_2$ gas to the wafer 200 in Step 1, it is possible to avoid deterioration of the surface roughness of the SiO film. The first layer formed on the wafer 200 becomes a Si-containing layer that contains not only Cl but also O. In the present disclosure, for the sake of convenience, the Si-containing layer that contains Cl and O may be referred to as a Cl- and Si-containing layer.

After the first layer is formed, the valves 243a and 243b are closed to stop the supply of the HCDS gas and the $O_2$ gas. At this time, while the APC valve 244 is in an open state, the interior of the process chamber 201 is vacuum-exhausted by the vacuum pump 246 to remove, from the interior of the process chamber 201, the HCDS gas, the $O_2$ gas, or the reaction byproducts remaining in the process chamber 201, which have not reacted or remain after contributing to the formation of the first layer. In this operation, the supply of the $N_2$ gas into the process chamber 201 is maintained by keeping the valves 243c and 243d in an open state. The $N_2$ gas acts as a purge gas to enhance the effect of removing the gas remaining in the process chamber 201 from the interior of the process chamber 201.

In this case, the gas remaining within the process chamber 201 may not be completely removed and the interior of the process chamber 201 may not be completely purged. If the amount of the gas remaining within the process chamber 201 is small, an adverse effect may not be generated in Step 2, which is performed subsequently. The flow rate of the $N_2$ gas supplied into the process chamber 201 need not be a large flow rate. For example, approximately the same amount of the $N_2$ gas as the volume of the reaction tube 203 (or the process chamber 201) may be supplied to perform the purging process such that there is no adverse effect to be generated in Step 2. As such, by not completely purging the interior of the process chamber 201, it is possible to shorten a purging time and to improve throughput. It is also possible to suppress the consumption of the $N_2$ gas to a necessary minimum level.

As the precursor gas, in addition to the HCDS gas, it may be possible to use, for example, chlorosilane precursor gas such as monochlorosilane ($SiH_3Cl$) gas, dichlorosilane ($SiH_2Cl_2$) gas, trichlorosilane ($SiHCl_3$) gas, tetrachlorosilane ($SiCl_4$) gas, or the like.

Furthermore, as the precursor gas, in addition to the chlorosilane precursor gas, it may be possible to use tetrafluorosilane ($SiF_4$) gas, tetrabromosilane ($SiBr_4$) gas, tetraiodosilane ($SiI_4$) gas, or the like. As such, as the precursor gas, it may be possible to use a halosilane precursor gas (halosilane compound) such as a chlorosilane precursor gas (chlorosilane compound), a fluorosilane precursor gas (fluorosilane compound), a bromosilane precursor gas (bromosilane compound), an iodosilane precursor gas (iodosilane compound), or the like.

Moreover, as the precursor gas, it may be possible to use an aminosilane precursor gas (aminosilane compound) such as tetrakisdimethylaminosilane ($Si[N(CH_3)_2]_4$, abbreviation: 4DMAS) gas, trisdimethylaminosilane ($Si[N(CH_3)_2]_3H$, abbreviation: 3DMAS) gas, bisdiethylaminosilane ($Si[N(C_2H_5)_2]_2H_2$, abbreviation: BDEAS) gas, bis (tertiary) butylaminosilane ($SiH_2[NH(C_4H_9)]_2$, abbreviation: BTBAS) gas, diisopropylaminosilane ($SiH_3N[CH(CH_3)_2]_2$, abbreviation: DIPAS) gas, or the like. The aminosilane precursor gas is a gas that acts not only as a Si source but also as N and C sources.

Furthermore, as the precursor gas, it may be possible to use a silicon hydride gas (silicon hydride compound) such as monosilane ($SiH_4$) gas, disilane ($Si_2H_6$) gas, trisilane ($Si_3H_8$) gas, or the like.

Moreover, as the precursor gas, it may be possible to use a siloxane-based precursor gas (siloxane compound) such as hexamethyldisiloxane ($[(CH_3)_3Si]_2O$) gas, tetramethyldisiloxane ($[H(CH_3)_2Si]_2O$) gas, hexachlorodisiloxane ($[Cl_3Si]_2O$) gas, tetrachlorodisiloxane ($(HCl_2Si)_2O$) gas, or the like. The term "siloxane compound" used herein refers to a compound having Si and O as a skeleton, and is a generic name of compounds having a Si—O—Si bond (siloxane bond). The siloxane precursor gas acts as a Si source, an O source, or O and C sources.

Furthermore, as the precursor gas, it may be possible to use a silazane-based precursor gas (silazane compound) such as, for example, hexamethyldisilazane ($[(CH_3)_3Si]_2NH$) gas, tetramethyldisilazane ($[H(CH_3)_2Si]_2NH$) gas, hexachlorodisilazane ($[Cl_3Si]_2NH$) gas, tetrachlorodisilazane ($(HCl_2Si)_2NH$) gas, or the like. The term "silazane compound" used herein refers to a compound having Si and N as a skeleton and is a generic name of compounds having a Si—N—Si bond, a Si—N bond, or the like. The silazane precursor gas acts as a Si source, an N source, or N and C sources.

In this manner, as the precursor gas, it may be possible to use at least one selected from a group consisting of a silane compound (a halosilane compound, an aminosilane compound, or a silicon hydride compound), a siloxane compound, and a silazane compound. Prolysis temperature of the siloxane compound and the silazane compound tends to be higher (i.e., less likely to be autolyzed) than that of the silane compound. If the film forming temperature is set to be in a high temperature range, using the siloxane compound or the silazane compound as the precursor gas makes it possible to suppress excessive pyrolysis and to enhance the controllability of the film forming process.

As the second O-containing gas, in addition to the $O_2$ gas, it may be possible to use nitrous oxide ($N_2O$) gas, nitrogen monoxide (NO) gas, nitrogen dioxide ($NO_2$) gas, ozone ($O_3$) gas, or the like.

As the inert gas, in addition to the $N_2$ gas, it may be possible to use a rare gas such as, for example, Ar gas, He gas, Ne gas, Xe gas, or the like.

[Step 2]

After Step 1 is completed, $O_2$ gas and $H_2$ gas are separately supplied into the process chamber 201 and are mixed in the process chamber 201 to react with each other. As such, Step 2 includes a time period in which the $O_2$ gas and the $H_2$ gas are simultaneously supplied.

In this step, the opening/closing control of the valves 243b and 243a is performed in the same manner as the opening/closing control of the valves 243b and 243a performed in Step 1. The flow rates of the $O_2$ gas and the $H_2$ gas flowing through the gas supply pipes 232b and 232a are controlled by the MFCs 241b and 241a, respectively. The $O_2$ gas and the $H_2$ gas are supplied into the process chamber 201 via the valves 249b and 249a. The $O_2$ gas and the $H_2$ gas are initially mixed in the process chamber 201 to react with each other and are subsequently exhausted from the exhaust pipe 231.

In this operation, the APC valve 244 is appropriately adjusted to set the internal pressure of the process chamber 201 to a pressure which falls within a range, for example, of 0.1 to 10 Torr (13.3 to 1,333 Pa), preferably 0.1 to 3 Torr (13.3 to 399 Pa).

The supply flow rate of the $O_2$ gas controlled by the MFC 241b is set to a flow rate greater than the supply flow rate of the $O_2$ gas supplied in Step 1 and is set to a flow rate capable of sufficiently oxidizing the first layer formed in Step 1. The supply flow rate of the $O_2$ gas controlled by the MFC 241b is set to a flow rate which falls within a range, for example, of 100 to 10,000 sccm. The supply flow rate of the $H_2$ gas controlled by the WC 241a is set to a flow rate which falls within a range, for example, of 100 to 10,000 sccm.

The time period during which the $O_2$ gas and the $H_2$ gas are supplied to the wafer 200 is set to fall within a range, for example, of 1 to 100 seconds, preferably 1 to 50 seconds.

Other processing conditions are the same as those in Step 1.

By supplying the $O_2$ gas and the $H_2$ gas into the process chamber 201 under the aforementioned conditions, the $O_2$ gas and the $H_2$ gas are thermally activated (excited) in a non-plasma manner under a heated and depressurized atmosphere so as to react with each other. Thus, moisture ($H_2O$)-free oxidizing species containing oxygen such as atomic oxygen (O) or the like are generated. The first layer formed on the wafer 200 in Step 1 is oxidized mainly by the oxidizing species. Energy of the oxidizing species is greater than bonding energy of a Si—Cl bond, a Si—H bond, or the like contained in the Si-containing layer. Thus, the Si—Cl bond, the Si—H bond, or the like contained in the first layer is broken by applying the energy of the oxidizing species to the first layer. H, Cl, or the like, whose bonding to Si has been broken, is removed from the film and is discharged as $Cl_2$, HCl, or the like. A bond of Si left after the bonding to H, Cl, or the like has been broken is connected to O contained in the oxidizing species, whereby a Si—O bond is formed. In this manner, the first layer is changed (modified) to a second layer, namely a SiO layer having a reduced amount of impurities such as Cl and the like. According to this oxidizing process, it is possible to greatly improve the oxidizing power as compared with the case of supplying $O_2$ gas only or the case of supplying water vapor ($H_2O$ gas). As such, by adding the $H_2$ gas to the $O_2$ gas under a depressurized atmosphere, it is possible to achieve an effect of greatly improving the oxidizing power as compared with the case of supplying $O_2$ gas only or the case of supplying $H_2O$ gas.

After the first layer is changed to the second layer, the valves 243b and 243a are closed to stop the supply of the $O_2$ gas and the $H_2$ gas. Under the same processing procedures and processing conditions as those of Step 1, the $O_2$ gas, the $H_2$ gas, or the reaction byproducts remaining in the process chamber 201, which have not reacted or remain after contributing to the oxidizing process, are removed from the interior of the process chamber 201. In this operation, like Step 1, the gas or the like remaining in the process chamber 201 may not be completely discharged.

As the first O-containing gas, in addition to the $O_2$ gas, it may be possible to use $N_2O$ gas, NO gas, $NO_2$ gas, $O_3$ gas, atomic oxygen (O), oxygen radical (O*), hydroxyl radical (OH*), or the like. As such, the first O-containing gas and the second O-containing gas may be gases having the same molecular structure (chemical structure) or may be gases having different molecular structures. In other words, the materials of the first O-containing gas and the second O-containing gas may be the same or may be different. If the same material is used for the first O-containing gas and the second O-containing gas, it is possible to simplify the structure of the gas supply system and to reduce a manufacturing cost or maintenance cost of the substrate processing apparatus. If different materials are used for the first O-containing gas and the second O-containing gas, for example, if a material weaker in oxidizing power than the first O-containing gas is used as the second O-containing gas, it is possible to suppress an excessive gas phase reaction in Step 1 and to enhance the controllability of the film thickness uniformity. For example, if $O_3$ gas or $O_2$ gas is used for the first O-containing gas, it is preferred that $N_2O$ gas, NO gas, $NO_2$ gas, or the like is used for the second O-containing gas.

As the H-containing gas, in addition to the $H_2$ gas, it may be possible to use deuterium ($D_2$) gas or the like. If an aminosilane precursor gas is used as the precursor gas and the $O_3$ gas is used as the first O-containing gas, it is possible to perform a film forming process at a sufficient (identical) deposition rate without having to use the H-containing gas.

As the inert gas, in addition to the $N_2$ gas, it may be possible to use, for example, the various rare gases described with respect to Step 1.

(Performing Predetermined Number of Times)

A cycle, which includes non-simultaneously, i.e., non-synchronously, performing above-described Steps 1 and 2, is performed a predetermined number of times (i.e., n times) to form a SiO film having a predetermined thickness on the wafer 200. The above cycle may be repeated multiple times. As such, a thickness of the second layer formed when the cycle is performed once may be set to be smaller than a desired or specified film thickness, and the cycle may be repeated multiple times until the film thickness of the SiO film formed by laminating the second layers becomes equal to the desired or specified film thickness.

(Purge and Return to Atmospheric Pressure)

After forming the SiO film is completed, the $N_2$ gas is supplied into the process chamber 201 from each of the gas supply pipes 232c and 232d and is exhausted from the exhaust pipe 231. The $N_2$ gas serves as a purge gas. Thus, the interior of the process chamber 201 is purged to remove any gas or reaction byproducts remaining in the process chamber 201 from the interior of the process chamber 201 (after-purge). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unloading and Wafer Discharging)

The seal cap 219 is moved down by the boat elevator 115 and the lower end of the manifold 209 is opened. Then, the processed wafers 200 are unloaded from the lower end of the manifold 209 out of the reaction tube 203 in a state in which the processed wafers 200 are supported on the boat 217 (boat unloading). The processed wafers 200 are discharged from the boat 217 (wafer discharging).

(3) EFFECTS ACCORDING TO THE PRESENT EMBODIMENT

According to the present embodiment, one or more effects described below may be achieved.

(a) By forming (depositing) the SiO film on the wafer 200 without oxidizing the surface of the wafer 200, it is possible to restrain the diffusion of O to an underlying layer, i.e., the surface of the wafer 200, in the film forming process. Thus, it is possible to form a SiO film having a desired insulation property while satisfying specifications required when a semiconductor device is manufactured. For example, when a memory device having a three-dimensional structure is manufactured, it is required to form a SiO film having a desired insulation property while a diffusion depth of O to an underlying layer is limited to fall within a permissible range. According to the film forming technique of the present embodiment, since the SiO film is deposited on the wafer 200, it is possible to form a film compatible with the aforementioned requirements in a balanced manner. In contrast, according to a technique (thermal oxidation method) in which the surface of the wafer 200 is oxidized and changed to a SiO layer, it may be difficult to form a film compatible with the aforementioned requirements.

(b) By forming the SiO film according to the alternate supply method in which Steps 1 and 2 are non-simultaneously performed, it is possible to improve the step coverage, the film thickness controllability, and the in-plane film thickness uniformity of the SiO film, as compared with the case where the SiO film is formed by a simultaneous supply method in which Steps 1 and 2 are simultaneously performed. This film forming method is particularly effective when an underlying surface of the film forming process has a three-dimensional structure such as a line-and-space shape, a hole shape, a fin shape, or the like.

(c) When the film forming process is performed, setting the temperature of the wafer 200 to fall within the aforementioned temperature range makes it possible to form a SiO film having high-quality film properties. For example, by setting the film forming temperature to a temperature which falls within a range of 450 to 1,000 degrees C., as compared with the case where the film forming temperature is set to a temperature of lower than 450 degrees C., for example, a temperature which falls within a range of 250 to 400 degrees C., it is possible to improve etching resistance or insulation property of the SiO film, to extend a service life and to reduce an interfacial electron trap density which affects a response speed of a transistor. In particular, by setting the film forming temperature to a temperature which falls within a range of 700 to 1,000 degrees C., it is possible to further improve the properties of the SiO film described above.

(d) In Step 1, by simultaneously supplying the HCDS gas and the $O_2$ gas to the wafer 200, it is possible to suppress the migration of Si contained in the first layer and to improve the interface roughness between the SiO film and its underlying layer or the surface roughness of the SiO film. In contrast, as to an ordinary alternate supply method in which only the HCDS gas is supplied to the wafer 200 in Step 1, the inventors of the present disclosure have found that the migration of Si may become active and the surface roughness of the wafer 200 deteriorates.

The effect of improving the surface roughness, which is obtained by simultaneously supplying the HCDS gas and the $O_2$ gas in Step 1, is similarly obtained not only when the film forming temperature is set to a temperature which falls within a range of 450 to 1,000 degrees C. but also when the film forming temperature is set to a lower temperature. For example, even when the film forming temperature is set to a temperature of lower than 450 degrees C., for example, a temperature which falls within a range of 250 to 400 degrees C., by simultaneously supplying the HCDS gas and the $O_2$ gas in Step 1, as compared with the case where a conventional alternate supply method is used, it is possible to improve the surface roughness of the SiO film. However, as described above, the migration of Si tends to become more active as the film forming temperature is set to be higher. For example, if the film forming temperature falls within a range of 700 to 1,000 degrees C., an amount of the migration of Si becomes considerable. Accordingly, the technical significance of simultaneously supplying the HCDS gas and the $O_2$ gas in Step 1 can be said to become particularly great when the film forming temperature is set to a temperature at which the migration of Si contained in the HCDS gas occurs remarkably if the only HCDS gas is supplied to the wafer 200, for example, a temperature which falls within a range of 700 to 1,000 degrees C.

(e) As described above, according to the present embodiment, it is possible to form a SiO film having superior properties which are hardly achieved in a thermal oxidation method, a simultaneous supply method, or an ordinary alternate supply method. The SiO film having such properties can be suitably used in an application such as a gate insulation film of a transistor or the like. It can be said that the SiO film according to the present embodiment is a revolutionary film which cannot be formed before employing a novel technical idea of simultaneously supplying the HCDS gas and the $O_2$ gas in Step 1, in spite of the background of technological innovation that employing an alternate supply method rather than a simultaneous supply method may be effective in improving step coverage or the like.

(f) The effects described above can be similarly achieved even when a precursor gas other than the HCDS gas is used, even when a first O-containing gas other than the $O_2$ gas is used, even when an H-containing gas other than the $H_2$ gas is used, or even when a second O-containing gas other than the $O_2$ gas is used.

(4) MODIFICATION EXAMPLES

The sequence of the film forming process according to the present embodiment is not limited to the basic sequence illustrated in FIG. 4 but may be modified as in the following modification examples illustrated in FIG. 4. For the sake of convenience, various kinds of modification examples of FIG. 4 are illustrated by extracting only the portions before and after Step 2 of a second cycle in the supply timing of the second O-containing gas.

Modification Examples 1 to 5

With respect to the basic sequence illustrated in FIG. 4, there is described an example in which a supply time of the second O-containing gas per cycle (a supply time $T_1$ of the $O_2$ gas in Step 1) is set to be equal to a supply time of the first O-containing gas per cycle (a supply time $T_2$ of the $O_2$ gas in step 2) (i.e., $T_1=T_2$) and is set to be equal to a supply time of the HCDS gas per cycle. However, the present embodiment is not limited to this aspect.

For example, as illustrated in Modification Examples 1 to 3 of FIG. 4, the supply of the second O-containing gas may be performed in only one of an initial section, an intermediate section, and a final section of an implementation time period of Step 1, whereby the supply time $T_1$ of the second O-containing gas per cycle may be set to be shorter than the supply time $T_2$ of the first O-containing gas per cycle (i.e., $T_1<T_2$). Furthermore, as illustrated in Modification Example 4 of FIG. 4, the supply of the second O-containing gas may be intermittently performed only in an initial section and a final section of the implementation time period of Step 1, whereby the supply time $T_1$ of the second O-containing gas per cycle (a total time) may be set to be shorter than the supply time $T_2$ of the first O-containing gas per cycle (i.e., $T_1<T_2$). Moreover, as illustrated in Modification Example 5 of FIG. 4, the supply of the second O-containing gas may be intermittently performed in an initial section, a middle section, and a final section of the implementation time period of Step 1, whereby the supply time period $T_1$ of the second O-containing gas per cycle (a total time) may be set to be shorter than the supply time $T_2$ of the first O-containing gas per cycle (i.e., $T_1<T_2$). These modification examples are also examples in which the supply time of the second O-containing gas per cycle is set to be shorter than the supply time of the HCDS gas per cycle.

According to these modification examples, the same effects as those of the basic sequence illustrated in FIG. 4 may be achieved. That is to say, if the supply time $T_1$ and the supply time $T_2$ are set as described above, even when the supply flow rate $F_1$ of the $O_2$ gas in Step 1 is set to be greater than or equal to the supply flow rate $F_2$ of the $O_2$ gas in step 2 ($F_1 F_2$), the supply amount $Q_1$ of the $O_2$ gas per cycle in Step 1 can be set to be smaller than the supply amount $Q_2$ of the $O_2$ gas per cycle in Step 2 ($Q_1<Q_2$). Thus, it is possible to suppress the migration of Si while an excessive gas phase reaction in Step 1 is suppressed. As a result, it is possible to form a SiO film having good surface roughness.

In Modification Examples 1, 4, and 5 in which the $O_2$ gas is supplied in an initial section of Step 1, as compared with Modification Examples 2 and 3 in which the $O_2$ gas is not supplied in an initial section of Step 1, it is possible to suppress the migration of Si immediately after the supply of the HCDS gas is started. For that reason, when the film forming process is implemented under a processing condition under which the migration of Si is likely to occur (e.g., under a processing condition of a relatively high temperature), it is desirable to select Modification Examples 1, 4, and 5. Furthermore, when the film forming process is implemented under a processing condition under which the migration of Si is less likely to occur (e.g., under a processing condition of a relatively low temperature), it may be desirable to select Modification Examples 2 and 3 rather than Modification Examples 1, 4, and 5.

In Modification Examples 4 and 5 in which the supply of the $O_2$ gas is intermittently performed multiple times during the implementation time period of Step 1, as compared with Modification Examples 1 to 3, it is possible to reliably suppress the migration of Si. It goes without saying that the basic sequence illustrated in FIG. 4, which continuously performs the supply of the $O_2$ gas during the implementation time period of Step 1, can suppress the migration of Si more reliably than these modification examples.

Modification Examples 6 to 9

With respect to the basic sequence illustrated in FIG. 4, there is described an example in which the supply of the HCDS gas and the supply of the $O_2$ gas are simultaneously performed in Step 1. However, the present embodiment is not limited to this aspect. The supply of the HCDS gas and the supply of the $O_2$ gas may be non-simultaneously performed.

For example, as illustrated in Modification Example 6 of FIG. 4, in Step 1, the supply of the $O_2$ gas may be started before the supply of the HCDS gas is started. After the supply of the $O_2$ gas is stopped, the supply of the HCDS gas may be started without implementing a step of purging the interior of the process chamber 201. In this case, as illustrated in Modification Examples 7 of FIG. 4, after the supply of the HCDS gas is stopped, the supply of the $O_2$ gas may be resumed without implementing a step of purging the interior of the process chamber 201. In this case, as illustrated in Modification Examples 8 and 9 of FIG. 4, there may be further provided a time period in which the supply of the $O_2$ gas and the supply of the HCDS gas are simultaneously performed in Step 1. These modification examples are directed to examples in which the supply time $T_1$ of the second O-containing gas per cycle is set to be shorter than the supply time $T_2$ of the first O-containing gas per cycle. Furthermore, these modification examples are directed to examples in which the supply time of the second O-containing gas per cycle is set to be shorter than the supply time of the HCDS gas per cycle.

According to these modification examples, the same effects as those of the basic sequence illustrated in FIG. 4 may be achieved. Furthermore, according to these modification examples, the supply of the HCDS gas is started in a state in which the interior of the process chamber 201 is converted to an $O_2$ gas atmosphere in advance. Thus, as compared with the basic sequence illustrated in FIG. 4, it is possible to more reliably suppress the migration of Si immediately after the supply of the HCDS gas is started. Furthermore, according to Modification Examples 7 and 8 in which the supply of the $O_2$ gas is resumed after the supply of the HCDS gas is stopped, as compared with the basic sequence illustrated in FIG. 4, it is possible to more reliably suppress the migration of Si after the supply of the HCDS gas is stopped.

Modification Examples 10 to 12

As illustrated in Modification Example 10 of FIG. 4, in addition to simultaneously performing the supply of the HCDS gas and the supply of the $O_2$ gas in Step 1, the supply of the $O_2$ gas may be started before the supply of the HCDS gas is started. Furthermore, as illustrated in Modification Example 11 of FIG. 4, in addition to simultaneously performing the supply of the HCDS gas and the supply of the $O_2$ gas in Step 1, the supply of the $O_2$ gas may be continuously performed after the supply of the HCDS gas is stopped. Moreover, as illustrated in Modification Example 12 of FIG. 4, in addition to simultaneously performing the supply of the HCDS gas and the supply of the $O_2$ gas in Step 1, the supply of the $O_2$ gas may be started before the supply of the HCDS gas is started, and may be continuously performed after the supply of the HCDS gas is stopped.

According to these modification examples, the same effects as those of the basic sequence illustrated in FIG. 4 may be achieved. Furthermore, according to Modification Examples 10 and 12 in which the supply of the $O_2$ gas is started before the supply of the HCDS gas is started, the supply of the HCDS gas to the wafer 200 is started in a state in which the interior of the process chamber 201 is converted to an $O_2$ gas atmosphere. Thus, as compared with the basic sequence illustrated in FIG. 4, it is possible to more reliably suppress the migration of Si immediately after the supply of the HCDS gas is started. Furthermore, according to Modification Examples 11 and 12 in which the supply of the $O_2$ gas is continuously performed after the supply of the HCDS gas is stopped, as compared with the basic sequence illustrated in FIG. 4, it is possible to more reliably suppress the migration of Si after the supply of the HCDS gas is stopped. These modification examples are directed to examples in which the supply time of the second O-containing gas per cycle is set to be longer than the supply time of the HCDS gas per cycle.

Modification Example 13

As illustrated in Modification Example 13 of FIG. 4, after the supply of the first O-containing gas is stopped in Step 2 of a previous cycle, the supply of the first O-containing gas may be continuously performed until the supply of the first O-containing gas is started in Step 2 of a following cycle. As such, when a cycle of non-simultaneously performing Steps 1 and 2 is performed a predetermined number of times, the supply of the second O-containing gas may be continuously performed. In the first cycle of this modification example, the supply of the second O-containing gas is started before the supply of the HCDS gas is started.

According to this modification example, the same effects as those of the basic sequence illustrated in FIG. 4 may be achieved. Furthermore, according to this modification example, as compared with the basic sequence illustrated in FIG. 4, it is possible to more reliably suppress the migration of Si immediately after the supply of the HCDS gas is started. Moreover, according to this modification example, as compared with the basic sequence illustrated in FIG. 4, it is possible to more reliably suppress the migration of Si after the supply of the HCDS gas is stopped. This modification example is directed to an example in which the supply time of the second O-containing gas per cycle is set to be longer than the supply time of the HCDS gas per cycle.

Modification Examples 14 and 15

As illustrated in Modification Example 14 of FIG. 4, in Step 1, the supply of the $O_2$ gas may be started before the supply of the HCDS gas is started, and the supply of the $O_2$ gas may be stopped before the supply of the HCDS gas is stopped. Furthermore, as illustrated in Modification Example 15 of FIG. 4, in Step 1, the supply of the $O_2$ gas may be started after the supply of the HCDS gas is started and before the supply of the HCDS gas is stopped, and may be continuously performed after the supply of the HCDS gas is stopped. These modification examples are directed to examples in which the supply time of the second O-containing gas per cycle is set to be shorter than the supply time of the HCDS gas per cycle.

According to these modification examples, the same effects as those of the basic sequence illustrated in FIG. 4 may be achieved. Furthermore, according to Modification Example 14, as compared with the basic sequence illustrated in FIG. 4, it is possible to more reliably suppress the migration of Si immediately after the supply of the HCDS gas is started. Moreover, according to Modification Example 15, as compared with the basic sequence illustrated in FIG. 4, it is possible to more reliably suppress the migration of Si after the supply of the HCDS gas is stopped.

Modification Examples 16 and 17

As illustrated in Modification Example 16 of FIG. 4, in Step 1, the supply of the HCDS gas and the supply of the $O_2$ gas may be simultaneously started. After the supply of the HCDS gas is stopped, the supply of the $O_2$ gas may be continuously performed until Step 2 is started. Furthermore, as illustrated in Modification Example 17 of FIG. 4, in Step 1, the supply of the $O_2$ gas may be started simultaneously with the stop of the supply of the first O-containing gas in Step 2 of a previous cycle. Thereafter, the supply of the $O_2$ gas may be stopped simultaneously with the stop of the supply of the HCDS gas. In Modification Example 17, the supply of the second O-containing gas is started in the first cycle before the supply of the HCDS gas is started.

According to these modification examples, the same effects as those of the basic sequence illustrated in FIG. 4 may be achieved. Furthermore, according to Modification Example 16, as compared with the basic sequence illustrated in FIG. 4, it is possible to more reliably suppress the migration of Si after the supply of the HCDS gas is stopped. Moreover, according to Modification Example 17, as compared with the basic sequence illustrated in FIG. 4, it is possible to more reliably suppress the migration of Si immediately after the supply of the HCDS gas is started.

Modification Examples 18 to 21

As illustrated in Modification Example 18 of FIG. 4, in Step 1, the supply of the HCDS gas and the supply of the $O_2$ gas may be simultaneously performed, and the supply flow rate of the $O_2$ gas may be gradually reduced. Furthermore, as illustrated in Modification Example 19 of FIG. 4, in Step 1, the supply of the HCDS gas and the supply of the O₂ gas may be simultaneously performed, and the supply flow rate of the O₂ gas may be gradually increased. Moreover, as illustrated in Modification Example 20 of FIG. 4, in step 1, the supply of the HCDS gas and the supply of the O₂ gas may be simultaneously started. After the supply of the HCDS gas is stopped, the supply of the O₂ gas may be continuously performed until Step 2 is started. The supply flow rate of the O₂ gas may be gradually increased until the supply flow rate of the O₂ gas becomes substantially equal to the supply flow rate of the O₂ gas in Step 2. In addition, as illustrated in Modification Example 21 of FIG. 4, in Step 1, the supply of the O₂ gas may be started before the supply of the HCDS gas is started, for example, simultaneously with the stop of the supply of the first O-containing gas in Step 2 of a previous cycle. Thereafter, the supply flow rate of the O₂ gas may be gradually reduced. Then, the supply of the O₂ gas may be stopped simultaneously with the stop of the supply of the HCDS gas. In Modification Example 21, the supply of the second O-containing gas is started in the first cycle before the supply of the HCDS gas is started.

According to these modification examples, the same effects as those of the basic sequence illustrated in FIG. 4 may be achieved. Furthermore, according to these modifications, it is possible to appropriately control the supply flow rate of the second O-containing gas within a cycle. This makes it possible to improve a quality of the film forming process and to reduce a gas cost. Moreover, according to Modification Examples 19 and 20, as compared with Modification Examples 18 and 21, it is possible to reliably suppress the migration of Si after the supply of the HCDS gas is stopped. In addition, according to Modification Examples 18 and 21, as compared with Modification Examples 19 and 20, it is possible to reliably suppress the migration of Si immediately after the supply of the HCDS gas is started.

Other Embodiments of the Present Disclosure

While one embodiment of the present disclosure is specifically described above, the present disclosure is not limited to the aforementioned embodiment but may be diversely modified without departing from the spirit of the present disclosure.

With respect to the above embodiment, there is described an example in which the first O-containing gas and the second O-containing gas are supplied from the same gas supply system. However, the present disclosure is not limited to this embodiment. For example, the first O-containing gas and the second O-containing gas may be individually supplied from different gas supply systems. In this example, the first O-containing gas and the second O-containing gas may be supplied from the same nozzle or may be individually supplied from different nozzles. By configuring the gas supply system in this manner, when the first O-containing gas is supplied at a relatively large flow rate or the second O-containing gas is supplied at a relatively small flow rate, it is possible to enhance the controllability of the supply flow rates of the first O-containing gas and the second O-containing gas. For example, if a large-flow-rate-purpose MFC is used in flow rate control of the first O-containing gas and if a small-flow-rate-purpose MFC is used in flow rate control of the second O-containing gas, it is possible to enhance the controllability of the flow rates of the first O-containing gas and the second O-containing gas. Thus, it is possible to enhance the controllability of the migration suppressing effect obtained by supplying the second O-containing gas together with the precursor gas and to further improve the surface roughness of the SiO film. Furthermore, it is possible to enhance the controllability of the gas phase reaction suppressing effect obtained when the second O-containing gas is supplied together with the precursor gas and to further improve the in-plane film thickness uniformity of the SiO film.

With respect to the aforementioned embodiment, there is described an example in which the SiO film is formed on the wafer 200 under a high-temperature condition using the HCDS gas, the O₂ gas, and the H₂ gas. However, the present disclosure is not limited to this embodiment. For example, the present disclosure may be suitably applied to a case where the SiO film is formed under an intermediate-temperature condition using the aminosilane precursor gas and O₃ gas, as described in the film forming sequences below. Furthermore, the present disclosure may be suitably applied to a case where the SiO film is formed under a low-temperature condition using the aminosilane precursor gas and plasma-excited O2 gas (hereinafter, also referred to as an O₂* gas). Instead of the aminosilane precursor gas, the aforementioned silicon hydride gas may be used.

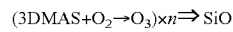
(3DMAS+O₂→O₃)×n ⇒ SiO

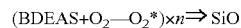
(BDEAS+O₂—O₂*)×n ⇒ SiO

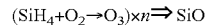
(SiH₄+O₂→O₃)×n ⇒ SiO

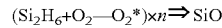
(Si₂H₆+O₂—O₂*)×n ⇒ SiO

Furthermore, the present disclosure may be suitably applied to a case where a silicon oxynitride film (SiON film), a silicon oxycarbide film (SiOC film), a silicon oxycarbonitride film (SiOCN film), a silicon borooxycarbonitride film (SiBOCN film), or a silicon borooxynitride film (SiBON film) is formed on the wafer 200 using, as the reaction gas, an N-containing gas such as ammonia (NH₃) gas or the like, an N- and C-containing gas such as triethylamine ((C₂H₅)₃N) gas or the like, a C-containing gas such as propylene (C₃H₆) gas or the like, or a B-containing gas such as trichloroborane (BCl₃) gas or the like, as described in the following film forming sequences.

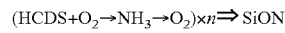
(HCDS+O₂→NH₃→O₂)×n ⇒ SiON (HCDS+O₂→(C₂H₅)₃N→O₂)×n ⇒ SiOC

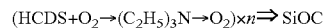
(HCDS+O₂→C₃H₆→NH₃)×n ⇒ SiOCN

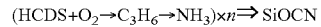
(HCDS+O₂→C₃H₆→NH₃→O₂)×n ⇒ SiOCN

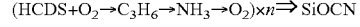
(HCDS+O₂→C₃H₆→O₂→NH₃)×n ⇒ SiOCN

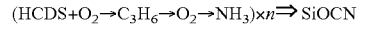
(HCDS+O₂→BCl₃→C₃H₆→NH₃)×n ⇒ SiBOCN

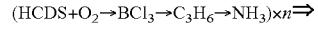
(HCDS+O₂→BCl₃→NH₃)×n ⇒ SiBON

Furthermore, the present disclosure may be suitably applied to a case where an oxide film (metal oxide film) containing, as a main element, a metal element such as titanium (Ti), zirconium (Zr), hafnium (Hf), tantalum (Ta), niobium (Nb), molybdenum (Mo), tungsten (W), yttrium (Y), strontium (Sr), lanthanum (La), ruthenium (Ru), aluminum (Al) or the like is formed. That is to say, the present disclosure may be suitably applied to a case where a TiO film, a TiON film, a TiOC film, a TiOCN film, a TiBOCN film, a TiBON film, a ZrO film, a ZrON film, a ZrOC film, a ZrOCN film, a ZrBOCN film, a ZrBON film, a HfO film, a HfON film, a HfOC film, a HfOCN film, a HfBOCN film, a HfBON film, a TaO film, a TaON film, a TaOC film, a TaOCN film, a TaBOCN film, a TaBON film, a NbO film, a NbON film, a NbOC film, a NbOCN film, a NbBOCN film, a NbBON film, a MoO film, a MoON film, a MoOC film, a MoOCN film, a MoBOCN film, a MoBON film, a WO film, a WON film, a WOC film, a WOCN film, a WBOCN film, a WBON film, a YO film, a YON film, a YOC film, a YOCN film, a YBOCN film, a YBON film, a SrO film, a SrON film, a SrOC film, a SrOCN film, a SrBOCN film, a SrBON film, a LaO film, a LaON film, a LaOC film, a LaOCN film, a LaBOCN film, a LaBON film, a RuO film, a RuON film, a RuOC film, a RuOCN film, a RuBOCN film, a RuBON film, an AlO film, an AlON film, an AlOC film, an AlOCN film, an AlBOCN film, or an AlBON film is formed on the wafer 200.

For example, the present disclosure may be suitably applied to a case where a metal oxide film such as a TiO film, a HfO film, a TaO film, an AlO film, or the like is formed on the wafer 200 by the film forming sequences described below using, as a precursor, titanium tetrachloride (TiCl$_4$) gas, hafnium tetrachloride (HfCl$_4$) gas, tantalum pentachloride (TaCl$_5$) gas, trimethylaluminum (Al(CH$_3$)$_3$) gas, or the like, and using, as the first O-containing gas, H$_2$O gas.

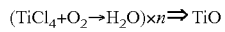

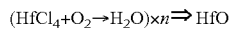

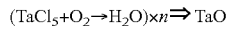

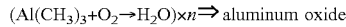

The processing procedures and the processing conditions of the film forming process in the above cases may be the same as the processing procedures and the processing conditions of the embodiment or modification examples described above. In these cases, the same effects as those of the embodiment or modifications described above may be achieved. That is to say, the present disclosure may be suitably applied to a case where a semi-metal oxide film containing, as a main element, a semi-metal element such as Si, Ge, B, or the like is formed, or a case where a metal oxide film containing, as a main element, the various kinds of metal elements described above.

The methods of the embodiment and modification examples described above may be suitably applied to a case where a gate insulation film provided with, for example, a FinFET, is formed. Hereinafter, the structure of the FinFET is described with reference to FIGS. 9A and 9B.

Figure 9A:
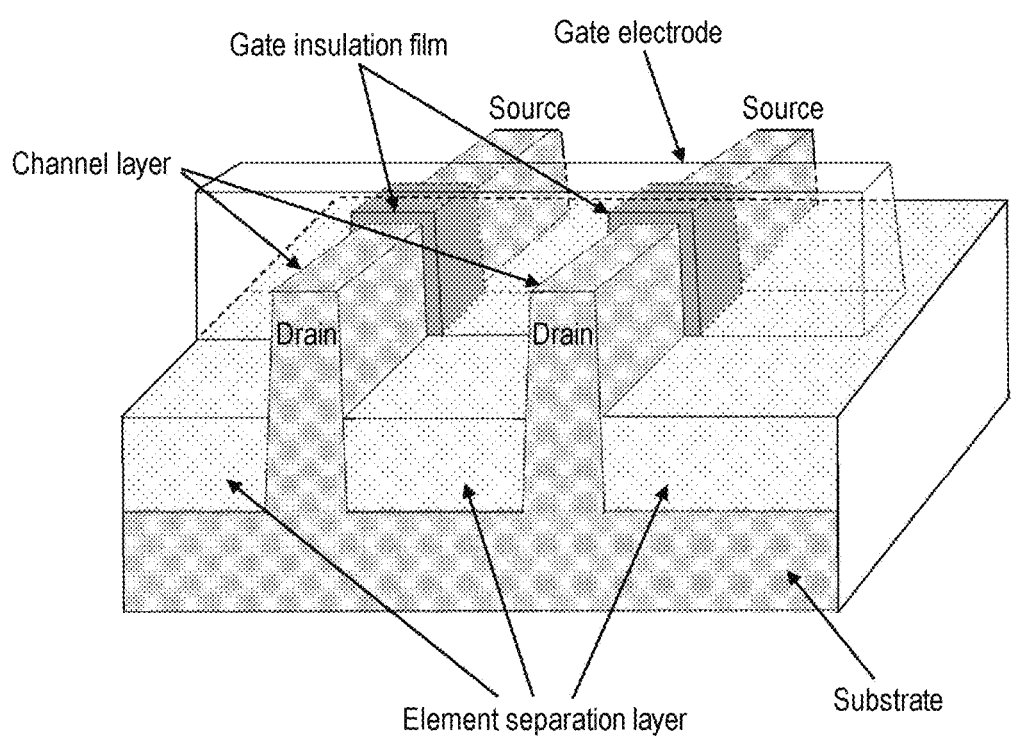
FIG. 9A is a partially enlarged view of a transistor including a SiO film as a gate insulation film in accordance with one embodiment of the present disclosure.
Figure 9B:
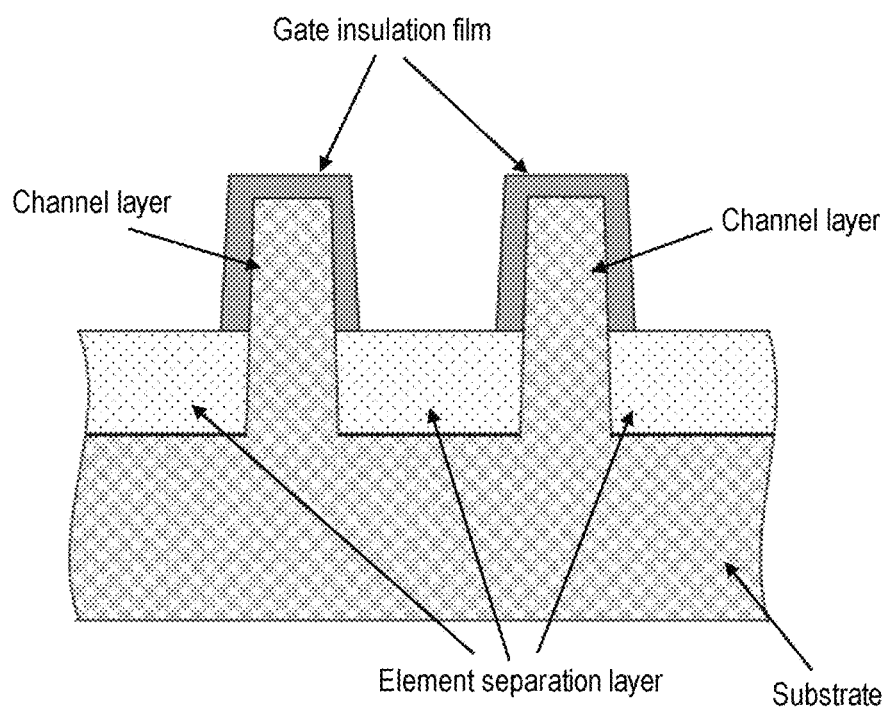
FIG. 9B is an enlarged sectional view of a transistor including a SiO film as a gate insulation film in accordance with one embodiment of the present disclosure.

As illustrated in FIGS. 9A and 9B, the FinFET includes a substrate configured as a Si wafer or the like, a channel layer formed on the substrate by Si or the like, and a gate electrode formed on the channel layer by titanium nitride (TiN) or the like. The channel layer is configured to interconnect a source-side electrode and a drain-side electrode of a transistor element. A gate insulation film composed of SiO and configured to electrically insulate the channel layer and the gate electrode is installed between the channel layer and the gate electrode. Adjacent channel layers are separated by an element separation layer composed of SiO or the like. In FIG. 9B, the gate electrode is not illustrated.

When the gate insulation film of the FinFET is formed, the same effects as those of the embodiment and modification examples described above may be achieved by applying the methods of the embodiment and modification examples as described above. That is to say, in the step of supplying the HCDS gas to the substrate, supplying the O$_2$ gas together with the HCDS gas to the substrate makes it possible to suppress the migration of Si contained in the layer formed on the wafer and to improve the interface roughness between the gate insulation film and its underlying layer or the surface roughness of the gate insulation film. As a result, it is possible to improve the electrical properties of the gate insulation film and to enhance performance of the transistor.

Recipes (programs describing processing procedures and processing conditions) used in substrate processing may be prepared individually according to the processing contents (a kind, composition ratio, quality, film thickness, processing procedure, and processing condition of the film as formed) and may be stored in the memory device 121c via a telecommunication line or the external memory device 123. Moreover, when the substrate processing starts, the CPU 121a may properly select an appropriate recipe from the recipes stored in the memory device 121c according to the processing contents. Thus, it is possible for a single substrate processing apparatus to form films of different kinds, composition ratios, qualities, and thicknesses with enhanced reproducibility. In addition, it is possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying existing recipes already installed in a substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

With respect to the aforementioned embodiment, there is described an example in which films are formed using a batch-type substrate processing apparatus capable of processing a plurality of substrates at a time. The present disclosure is not limited to the aforementioned embodiment but may be appropriately applied, for example, to a case where films are formed using a single-wafer-type substrate processing apparatus capable of processing a single substrate or several substrates at a time. In addition, with respect to the aforementioned embodiment, there is described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. Further, in these cases, the processing procedures and the processing conditions may be similar, for example, to the processing procedures and the processing conditions of the aforementioned embodiment.

Figure 7:
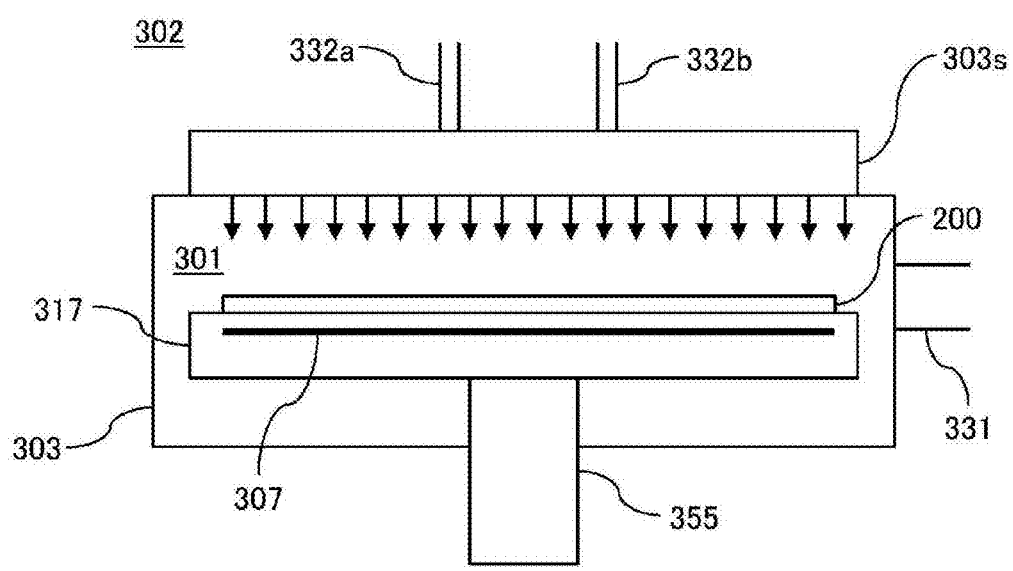
FIG. 7 schematically depicts a configuration of a processing furnace of a substrate processing apparatus suitably used in another embodiment of the present disclosure, in which a portion of the processing furnace is shown in a vertical cross-sectional view.

The present disclosure may be suitably applied, for example, to a case where a film is formed using a substrate processing apparatus provided with a processing furnace 302 illustrated in FIG. 7. The processing furnace 302 includes a process vessel 303 that forms a process chamber 301, a shower head 303s that serves as a gas supply part configured to supply gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A gas supply system similar to the precursor gas supply system and the H-containing gas supply system of the aforementioned embodiment is connected to the gas supply port 332a. A gas supply system similar to the O-containing gas supply system of the aforementioned embodiment is connected to the gas supply port 332b. A gas distribution plate configured to supply gas into the process chamber 301 in a shower-like manner is installed in outlets (gas discharge holes) of the shower head 303s. The shower head 303s is installed in such a position as to face surfaces of the wafers 200 carried into the process chamber 301. An exhaust port 331 configured to evacuate an interior of the process chamber 301 is installed to the process vessel 303. An exhaust system similar to the exhaust system of the aforementioned embodiment is connected to the exhaust port 331.

Figure 8:
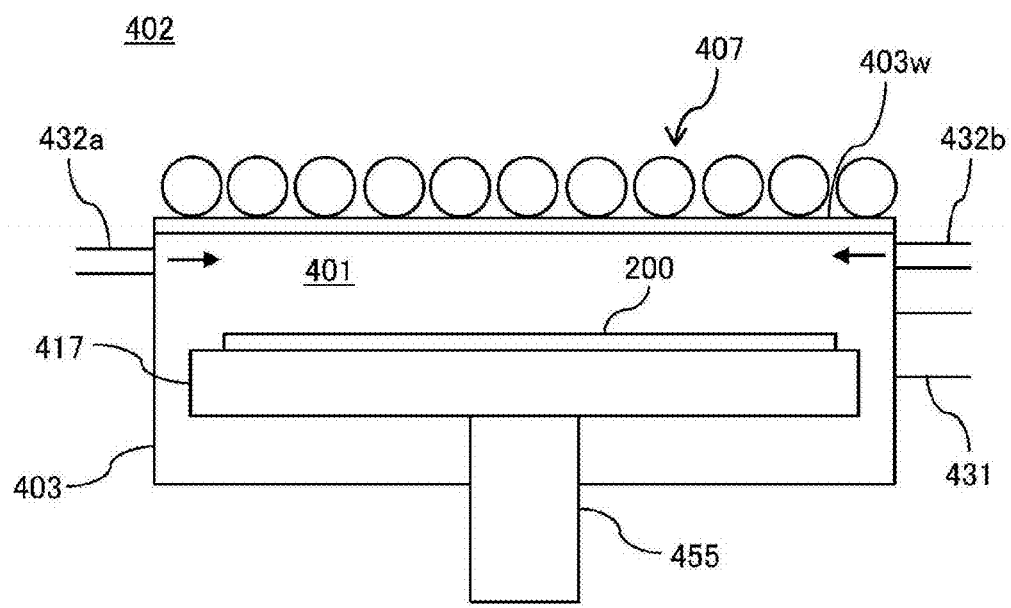
FIG. 8 schematically depicts a configuration of a processing furnace of a substrate processing apparatus suitably used in still another embodiment of the present disclosure, in which a portion of the processing furnace is shown in a vertical cross-sectional view.

In addition, the present disclosure may be suitably applied, for example, to a case where a film is formed using a substrate processing apparatus provided with a processing furnace 402 illustrated in FIG. 8. The processing furnace 402 includes a process vessel 403 that forms a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. Gas supply ports 432a and 432b are connected to the process vessel 403. A gas supply system similar to the precursor gas supply system and the H-containing gas supply system of the aforementioned embodiment is connected to the gas supply port 432a. A gas supply system similar to the O-containing gas supply system of the aforementioned embodiment is connected to the gas supply port 432b. Each of the gas supply ports 432a and 432b is installed to a lateral side of end portions of the wafers 200 carried into the process chamber 401, namely in such positions as not to face surfaces of the wafers 200 carried into the process chamber 401. An exhaust port 431 configured to evacuate the interior of the process chamber 401 is installed in the process vessel 403. An exhaust system similar to the exhaust system of the aforementioned embodiment is connected to the exhaust port 431.

In the case of using these substrate processing apparatuses, a film forming process may be performed according to sequences and processing conditions that are similar to those of the embodiment and modification examples described above. Effects similar to those of the embodiment and modification examples described above may be achieved.

The embodiment and modification examples described above may be appropriately combined with one another. In addition, the processing conditions used at this time may be similar, for example, to the processing conditions of the embodiment described above.

Implement Example

Hereinafter, experimental results that support the effects obtained in the above-described embodiment and modification examples are described.

In an implement example, a SiO film was formed on a wafer according to a basic sequence illustrated in FIG. 4 using the substrate processing apparatus of the above-described embodiment. HCDS gas was used as a precursor gas. $O_2$ gas was used as a first O-containing gas and a second O-containing gas. $H_2$ gas was used as an H-containing gas. The temperature of the wafer was set to a temperature which falls within a range of 700 to 900 degrees C. The ratio of the supply flow rate of the second O-containing gas to the supply flow rate of the first O-containing gas was set to be greater than or equal to 1/10, and smaller than or equal to 1/5. Other processing conditions were set to fall within the ranges of the processing conditions described in the aforementioned embodiment.

In a comparative example, a SiO film was formed on a wafer by using the substrate processing apparatus of the above-described embodiment according to a film forming sequence which alternately performs a step of supplying HCDS gas to the wafer and a step of supplying $O_2$ gas and a $H_2$ gas to the wafer. In the step of supplying the HCDS gas, the $O_2$ gas was not supplied. Other processing conditions were the same as the processing conditions of the above implement example.

Figure 6A:
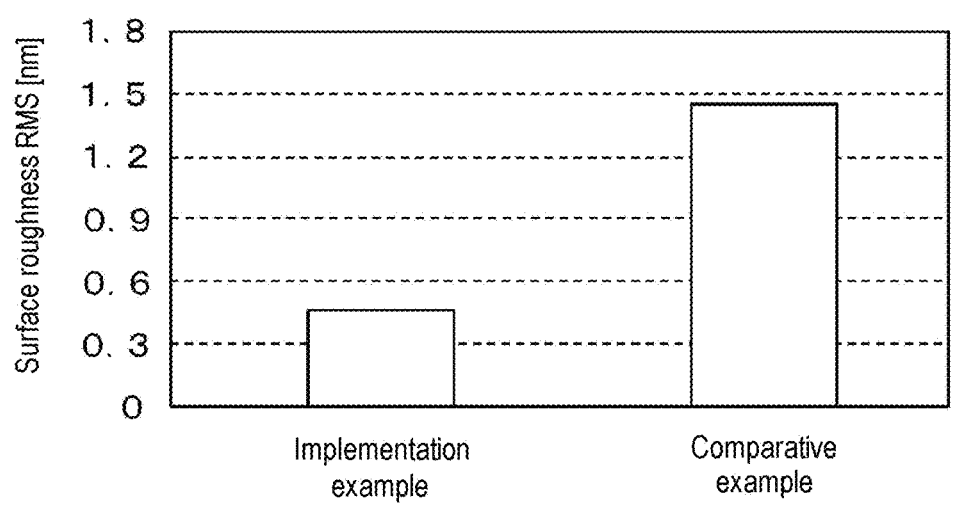
FIG. 6A illustrates evaluation results of surface roughness of SiO films in an example and a comparative example.
Figure 6B:
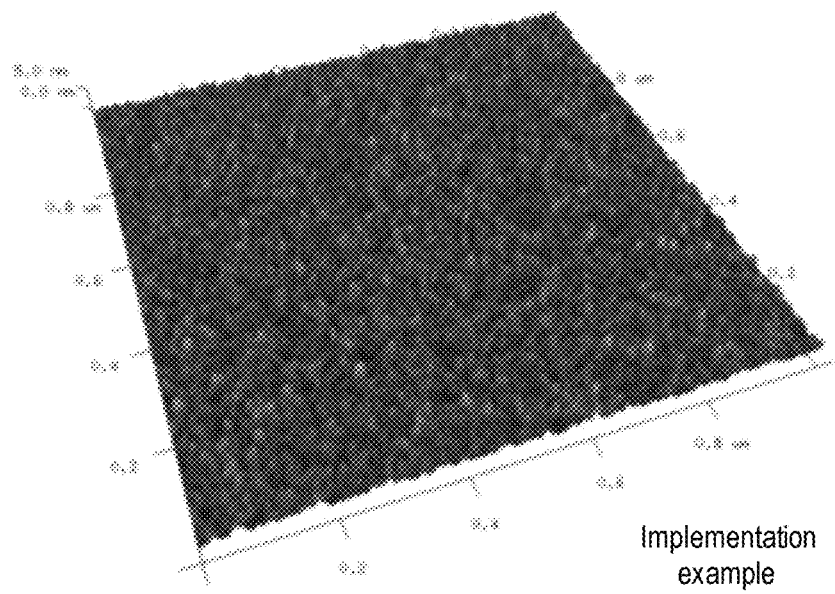
FIG. 6B shows an AFM image of a surface of the SiO film in the example.
Figure 6C:
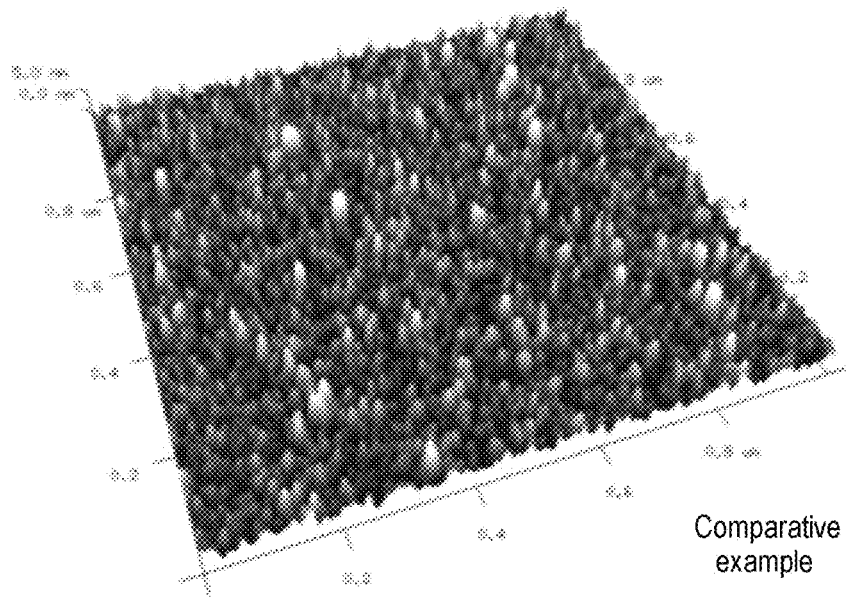
FIG. 6C shows an AFM image of a surface of the SiO film in the comparative example.

Then, the surface roughness (RMS) of the SiO films in the implement example and the comparative example was measured using an atomic force microscope. The term "RMS" used herein, which is a root mean roughness, means that smaller its value is, better the surface roughness of the SiO film is, namely smoother the surface of the SiO film is. FIG. 6A is a graph showing the measurement results of the RMS of the SiO films. The vertical axis indicates the RMS [nm] and the horizontal axis sequentially indicates the implement example and the comparative example. FIG. 6B shows an AFM image of the surface of the SiO film in the implement example. FIG. 6C shows an AFM image of the surface of the SiO film in the comparative example.

According to these figures, it can be noted that the RMS is smaller (the surface is smoother) in the implement example in which the $O_2$ gas is supplied when the HCDS gas is supplied than in the comparative example in which the $O_2$ gas is not supplied when the HCDS gas is supplied. Presumably, this is because the migration of Si can be suppressed by supplying the $O_2$ gas simultaneously with the supply of the HCDS gas.

According to the present disclosure in some embodiments, it is possible to enhance smoothness of a surface of an O-containing film that is formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate by performing a cycle multiple times, the cycle including non-simultaneously performing:
        supplying a precursor gas to the substrate; and
        supplying a first oxygen-containing gas to the substrate,
    wherein the act of supplying the precursor gas includes a time period in which the precursor gas and a second oxygen-containing gas are simultaneously supplied to the substrate without supplying a hydrogen-containing gas, and
    wherein a supply amount of the second oxygen-containing gas per cycle is set to be smaller than a supply amount of the first oxygen-containing gas per cycle.

2. The method of claim 1, wherein a supply flow rate of the second oxygen-containing gas per cycle is set to be smaller than a supply flow rate of the first oxygen-containing gas per cycle.

3. The method of claim 1, wherein a ratio of a supply flow rate of the second oxygen-containing gas per cycle to a supply flow rate of the first oxygen-containing gas per cycle is set to be greater than or equal to 1/20, and smaller than or equal to 1/2.

4. The method of claim 1, wherein a ratio of a supply flow rate of the second oxygen-containing gas per cycle to a supply flow rate of the first oxygen-containing gas per cycle is set to be greater than or equal to 1/10, and smaller than or equal to 1/5.

5. The method of claim 1, wherein a supply time of the second oxygen-containing gas per cycle is set to be shorter than or equal to a supply time of the first oxygen-containing gas per cycle.

6. The method of claim 1, wherein the act of supplying the first oxygen-containing gas includes a time period in which the first oxygen-containing gas and a hydrogen-containing gas are simultaneously supplied to the substrate.

7. The method of claim 1, wherein the first oxygen-containing gas and the second oxygen-containing gas have the same molecular structure.

8. The method of claim 1, wherein the first oxygen-containing gas and the second oxygen-containing gas have different molecular structures.

9. The method of claim 1, wherein in the act of forming the film on the substrate, a temperature of the substrate is set to a temperature at which the precursor gas is pyrolized.

10. The method of claim 1, wherein a temperature of the substrate is set to be higher than or equal to 700 degrees C., and lower than or equal to 1000 degrees C.

11. The method of claim 1, wherein the precursor gas includes at least one selected from a group consisting of a silane compound, a siloxane compound, and a silazane compound.

12. The method of claim 1, wherein the first oxygen-containing gas includes at least one selected from a group consisting of oxygen gas, nitrous oxide gas, nitric oxide gas, nitrogen dioxide gas, ozone gas, atomic oxygen, an oxygen radical, and a hydroxyl radical, and
wherein the second oxygen-containing gas includes at least one selected from a group consisting of oxygen gas, nitrous oxide gas, nitric oxide gas, nitrogen dioxide gas, and ozone gas.

13. The method of claim 1, wherein a temperature of the substrate in the act of supplying the precursor gas is the same as a temperature of the substrate in the act of supplying the first oxygen-containing gas.

14. The method of claim 1, wherein in the act of supplying the first oxygen-containing gas, the first oxygen-containing gas is supplied to the substrate without supplying the precursor gas.

15. The method of claim 1, wherein the act of supplying the first oxygen-containing gas includes a time period in which the first oxygen-containing gas and a hydrogen-containing gas are simultaneously supplied to the substrate without supplying the precursor gas.

* * * * *